(12) United States Patent
Handa

(10) Patent No.: US 7,532,991 B2
(45) Date of Patent: May 12, 2009

(54) MAGNETIC DATA PROCESSING DEVICE

(75) Inventor: Ibuki Handa, Iwata (JP)

(73) Assignee: Yamaha Corporation, Shizuoka-Ken (JP)

( * ) Notice: Subject to any disclaimer, the term of this patent is extended or adjusted under 35 U.S.C. 154(b) by 0 days.

(21) Appl. No.: 11/682,379

(22) Filed: Mar. 6, 2007

(65) Prior Publication Data

US 2007/0213950 A1    Sep. 13, 2007

(30) Foreign Application Priority Data

| Mar. 7, 2006 | (JP) | ............................. 2006-061605 |
| May 10, 2006 | (JP) | ............................. 2006-132026 |
| Jan. 26, 2007 | (JP) | ............................. 2007-016320 |

(51) Int. Cl.
*G01C 25/00* (2006.01)
*G01C 17/38* (2006.01)
*G01D 18/00* (2006.01)
*G06F 19/00* (2006.01)
*G01R 27/28* (2006.01)

(52) U.S. Cl. .................... 702/92; 702/104; 33/355 R; 33/357; 33/358; 33/356; 73/514.31; 73/314.39; 324/650

(58) Field of Classification Search ............... 702/92, 702/104
See application file for complete search history.

(56) References Cited

U.S. PATENT DOCUMENTS

| 4,497,034 | A  | * | 1/1985  | Kuno et al. ................... 702/92 |
| 5,165,269 | A  | * | 11/1992 | Nguyen ...................... 73/1.76 |
| 6,445,178 | B1 | * | 9/2002  | Hoekstra ................ 324/207.12 |
| 6,643,941 | B2 | * | 11/2003 | Parks et al. .................... 33/356 |
| 6,922,647 | B2 | * | 7/2005  | Cho et al. ...................... 702/92 |
| 7,119,533 | B2 | * | 10/2006 | Tamura et al. ............... 324/202 |
| 7,210,236 | B2 | * | 5/2007  | Sato et al. ...................... 33/356 |
| 2005/0256673 | A1 | | 11/2005 | Hikida et al. |
| 2006/0032064 | A1 | | 2/2006  | Sato et al. |

FOREIGN PATENT DOCUMENTS

| EP | 1 698 857 A1 | 9/2006 |
| WO | WO-2004/003476 A1 | 1/2004 |
| WO | WO-2005/061990 A1 | 7/2005 |

* cited by examiner

*Primary Examiner*—Eliseo Ramos Feliciano
*Assistant Examiner*—Janet L Suglo
(74) *Attorney, Agent, or Firm*—DicksteinshapiroLLP

(57) ABSTRACT

In a magnetic data processing device, an input part sequentially inputs magnetic data outputted from a two-dimensional or three-dimensional magnetic sensor. The magnetic data is two-dimensional or three-dimensional vector data that is a linear combination of a set of fundamental vectors. The magnetic data processing device stores a plurality of the inputted magnetic data as a data set of statistical population in order to update an old offset of the magnetic data with a new offset. An offset derivation part derives the new offset based on the old offset and the data set of statistical population under a constraint condition that the new offset be obtained as the sum of the old offset and a correction vector.

16 Claims, 16 Drawing Sheets

MAGNETIC DATA
DISTRIBUTION RANGE

MAGNETIC DATA DISTRIBUTION RANGE

DISTRIBUTION RANGE OF DATA SET OF STATISTICAL POPULATION

///// DISTRIBUTION RANGE OF DATA
SET OF STATISTICAL
POPULATION

MAGNETIC DATA PROCESSING DEVICE

BACKGROUND OF THE INVENTION

1. Technical Field of the Invention

The present invention relates to a magnetic data processing device, magnetic data processing method, and magnetic data processing program, and more particularly to a technology for correcting an offset of two-dimensional and three-dimensional magnetic sensors.

2. Description of the Related Art

A conventional magnetic sensor mounted on a moving body such as a mobile phone or a vehicle detects the direction of an Earth's magnetic field or geomagnetism. The magnetic sensor includes a set of magnetic sensor modules to detect scalar components of the magnetic field vector in mutually orthogonal directions. Magnetic data output from the magnetic sensor consists of a combination of outputs of the magnetic sensor modules, and thus the magnetic data is vector data that is a linear combination of mutually orthogonal unit vectors (fundamental vectors). The direction and magnitude of the magnetic data corresponds to the direction and magnitude of a magnetic field detected by the magnetic sensor. When specifying the direction or magnitude of an Earth's magnetic field based on outputs of the magnetic sensor, it is necessary to perform a process for correcting the outputs of the magnetic sensor in order to negate measurement errors caused by magnetization of the moving body or inherent temperature characteristics of the magnetic sensor. A control value of this correction process is referred to as an offset and a process for deriving the offset is referred to as calibration (see, for example, International Patent Publication No. 2004-003476). The offset is also vector data and defined as magnetic data output from the magnetic sensor when the intensity of external magnetic fields is zero. Such measurement errors are negated by subtracting the offset from the magnetic data output from the magnetic sensor. In a two-dimensional (2D) magnetic sensor, the offset corresponds to a position vector of the center of a circle on which a magnetic data set is distributed. However, practically, the distribution of a magnetic data set output from the 2D magnetic sensor does not form a perfect circle. The reasons are that outputs of magnetic sensor modules inherently have measurement errors following Gaussian distribution, a magnetic field measured by the 2D magnetic sensor varies during a period in which a data set of statistical population is stored to calculate the offset since in practice there is no completely uniform magnetic field, and calculation errors occur during AD conversion.

The 2D magnetic sensor outputs a data set of statistical population required to derive the offset while a moving body including the 2D magnetic sensor mounted thereon rotates such that the 2D magnetic sensor rotates about a rotation axis parallel to the direction perpendicular to orthogonal sensitive directions of its magnetic sensor modules. To move, in this manner, a moving body such as a mobile phone or a vehicle which is movable three-dimensionally, it is necessary for the user to intentionally operate the moving body so that it moves in such a manner. Accordingly, an offset derivation algorithm for a magnetic data processing device for deriving the offset of a 2D magnetic sensor is designed under the assumption that the user is explicitly informed of start of calibration and the user operates the moving body appropriately. However, it is troublesome and complicated for the user to perform the operation for calibration. In the conventional calibration method, it is determined, through binary decision, whether or not a reliable data set of statistical population has been stored, and, when the user has not correctly performed the operation for calibration, the calibration fails without storing a reliable data set of statistical population. This requires the user to repeat the operation for storing a reliable data set of statistical population.

A conventional 3-dimensional (3D) magnetic sensor mounted on a moving body such as a mobile phone or a vehicle detects the direction of an Earth's magnetic field. The 3D magnetic sensor generally includes 3 magnetic sensor modules to detect scalar components of the magnetic field vector in 3 orthogonal directions. Magnetic data output from the 3D magnetic sensor consists of a combination of outputs of the 3 magnetic sensor modules, and thus the magnetic data is 3D vector data that is a linear combination of mutually orthogonal unit vectors (fundamental vectors). The direction and magnitude of the magnetic data corresponds to the direction and magnitude of a magnetic field detected by the 3D magnetic sensor. When specifying the direction or magnitude of an Earth's magnetic field based on outputs of the 3D magnetic sensor, it is necessary to perform a process for correcting the outputs of the 3D magnetic sensor in order to negate measurement errors caused by magnetization of the moving body or inherent temperature characteristics of the magnetic sensor. A control value of this correction process is referred to as an offset. The offset is vector data indicating a magnetic field caused by the magnetization components of the moving body detected by the 3D magnetic sensor. Such measurement errors are negated by subtracting the offset from the magnetic data output from the 3D magnetic sensor. It is possible to calculate the offset by obtaining the center of a spherical surface on which a magnetic data set is distributed.

However, practically, the distribution of magnetic data does not form a perfect sphere. The reasons are that outputs of the 3D magnetic sensor inherently have measurement errors following Gaussian distribution, a magnetic field measured by the 3D magnetic sensor varies during a period in which magnetic data required to calculate the offset is stored since in practice there is no completely uniform magnetic field, and calculation errors occur until digital values are obtained from the outputs of the 3D magnetic sensor.

A conventional method for deriving a magnetic sensor offset stores a large number of magnetic data and derives the offset through a statistical process of the stored magnetic data. Thus, in the conventional method, a magnetic data set required to accurately update the offset is not stored unless the user intentionally changes the attitude or posture of the moving body, and a long time is required to update the offset after the need to update the offset occurs. Usually, magnetic data distributed only in two dimensions is stored since a significant three-dimensional change in the attitude of the magnetic sensor mounted on the vehicle is rare. Thus, it is undesirable to wait until a magnetic data set evenly distributed on a spherical surface is stored in order to accurately update the offset of the magnetic sensor mounted on the vehicle.

International Patent Publication No. 2005-061990 has disclosed an algorithm which can correct the offset even if the distribution of a magnetic data set is two-dimensional. However, it is not easy to implement a program according to the algorithm described in International Patent Publication No. 2005-061990 since it is complicated.

SUMMARY OF THE INVENTION

It is an object of the present invention to improve the usability of a two-dimensional (2D) magnetic sensor and three-dimensional (3D) magnetic sensor.

It is another object of the present invention to provide a magnetic data processing device, magnetic data processing method, and magnetic data processing program, and a magnetic measurement apparatus, which can correct an offset using a stored magnetic data set through a simple process, regardless of distribution of the data set of statistical population.

In a first aspect of the invention, a magnetic data processing device for accomplishing the above objects comprises an input part that sequentially inputs magnetic data outputted from a two-dimensional (2D) magnetic sensor, the magnetic data being 2D vector data that is a linear combination of a set of first fundamental vectors; a storage part that stores a plurality of the inputted magnetic data as a data set of statistical population in order to update an old offset of the magnetic data with a new offset; and an offset derivation part that derives the new offset based on the old offset and the data set of statistical population under a constraint condition that the new offset be obtained as the sum of the old offset and a correction vector, where the correction vector is a linear combination of a set of second fundamental vectors defined in principle axis directions of distribution of the data set of statistical population, and respective coefficients of the linear combination of the second fundamental vectors representing the correction vector are obtained by weighting respective coefficients of a temporary position vector of a temporary offset relative to the old offset according to a ratio of principle values of the distribution of the data set of statistical population, the temporary offset being derived from the data set of statistical population without using the old offset, the temporary position vector being a linear combination of the second fundamental vectors.

In a second aspect of the invention, a magnetic data processing device for accomplishing the above objects comprises an input part that sequentially inputs magnetic data outputted from a three-dimensional (3D) magnetic sensor, the magnetic data being 3D vector data that is a linear combination of a set of first fundamental vectors; a storage part that stores a plurality of the inputted magnetic data as a data set of statistical population in order to update an old offset of the magnetic data with a new offset; and an offset derivation part that derives the new offset based on the old offset and the data set of statistical population under a constraint condition that the new offset be obtained as the sum of the old offset and a correction vector, where the correction vector is a linear combination of a set of second fundamental vectors defined in principle axis directions of distribution of the data set of statistical population, and respective coefficients of the linear combination of the second fundamental vectors representing the correction vector are obtained by weighting respective coefficients of a position vector of a temporary offset relative to the old offset according to ratios of principle values of the distribution of the data set of statistical population, the temporary offset being derived from the data set of statistical population without using the old offset, the position vector of the temporary offset being a linear combination of the second fundamental vectors.

DETAILED DESCRIPTION OF THE INVENTION

Figure 1:
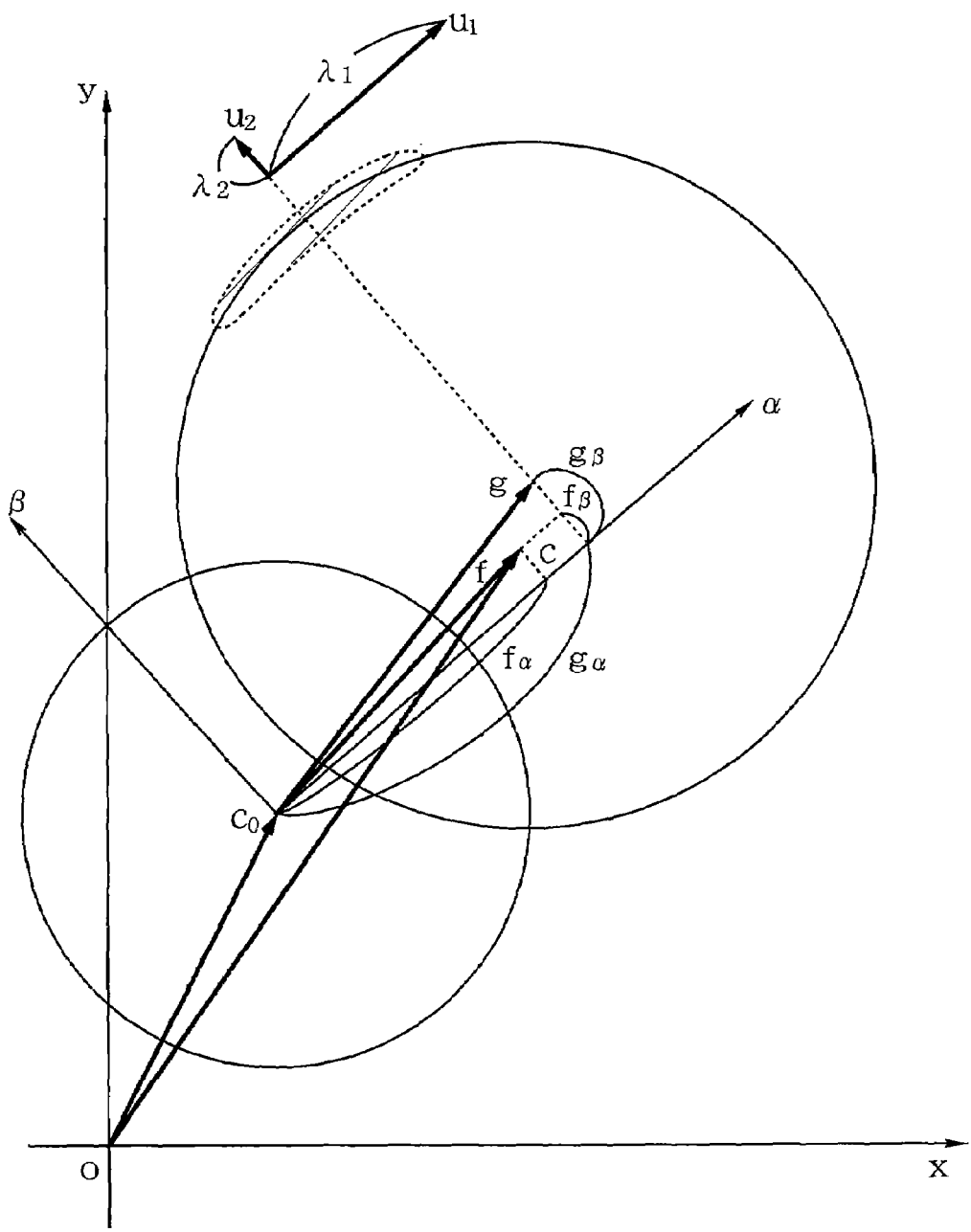
FIG. 1 is a schematic diagram of the embodiments of the first aspect of the present invention.

A principle and algorithm used in the first aspect of the invention is described below in detail with reference to FIG. 1. Key points of this algorithm are that a magnetic data set distributed in a principle axis direction with larger dispersion is estimated to be more significant elements of statistical population for use in updating the offset, and a magnetic data set distributed in a principle axis direction with smaller dispersion is estimated to be less significant elements of statistical population for use in updating the offset. Each of the old offset $c_0$, the new offset c, and the temporary offset, which corresponds to a position vector of the end point of "g" relative to the point of origin "0", is 2D position vector data that is a linear combination of a fundamental vector set of magnetic data. That is, each of the offsets is vector data represented in the xy coordinate system. The new offset c is derived based on the old offset $c_0$ and a magnetic data set that is stored to update the old offset $c_0$ with the new offset c.

The data set of statistical population, which is a magnetic data set stored to update the old offset with the new offset c, may include a magnetic data set that has been stored in a predetermined period of time and may include a magnetic data set including a predetermined number of magnetic data and may also include a magnetic data set including any number of magnetic data that has been stored at a certain time (for example, at the time when an offset update request is made). The old offset $c_0$ may be derived using the same method as the new offset c and may also be predetermined.

Although the temporary offset is defined to be derived from the data set of statistical population without using the old offset $c_0$, this definition is introduced to define the constraint condition under which the new offset c is derived and the temporary offset is actually not data which must be derived. If the temporary offset is actually derived from the data set of statistical population without using the old offset $c_0$, the temporary offset is a position vector of the center of a circumference near which the data set of statistical population is distributed. However, if the data set of statistical population is unevenly distributed near a narrow central-angle arc which is a part of the circumference derived from the data set of statistical population, an error included in each element of the data set of statistical population greatly affects the derivation result of the circumference and thus there is a possibility that a temporary offset distant from the true offset is derived. For example, let us consider that a data set of statistical population is unevenly distributed near a narrow central-angle arc and mutually orthogonal eigenvectors of the data set of statistical population are $u_1$ and $u_2$ as shown in FIG. 1. In this case, since the variance of the data set of statistical population is small in the direction of the eigenvector $u_2$ of the distribution corresponding to the smaller principle value, there is a high probability that a temporary offset derived from the data set of statistical population is distant from the true offset in the direction of the eigenvector $u_2$. On the other hand, in this case, since the variance of the data set of statistical population is large in the direction of the eigenvector $u_1$ of the distribution, there is a high probability that the temporary offset derived from the data set of statistical population is near the true offset in the direction of the eigenvector $u_1$.

Since the variances in the principle axis directions of the distribution can be expressed using the principle values $\lambda_1$ and $\lambda_2$ of the distribution as indicators of the distribution, this device estimates elements of statistical population distributed in the directions corresponding respectively to the principle values according to the ratios of the principle values $\lambda_1$ and $\lambda_2$. Specifically, first, a correction vector f, which is a position vector of the new offset c relative to the old offset $c_0$, and a temporary position vector g, which is a position vector of the temporary offset relative to the old offset $c_0$, can be defined in a coordinate system having coordinate axes α and β coincident with the principle axis directions of the distribution. That is, each of the correction vector f and the temporary position vector g can be defined to be a linear combination of fundamental vectors of the principle axis directions of the distribution. This corresponds to conversion into principle axis values. If the components $f_\alpha$ and $f_\beta$ of the correction vector f are derived by weighting the components $g_\alpha$ and $g_\beta$ of the position vector g of the temporary offset relative to the old offset $c_0$ according to the measures of the corresponding principle values $u_1$ and $u_2$ of the distribution, it is possible to derive the correction vector f by increasing the reliability of the elements of statistical population in a direction with large dispersion and decreasing the reliability of the elements of statistical population in a direction with small dispersion. However, such definitions of the correction vector f and the temporary position vector g are also introduced to define the constraint condition under which the new offset c is derived and each of the correction vector f and the temporary position vector g is actually not data which needs to be derived.

By deriving the new offset c under a constraint condition that the new offset c be obtained as the sum of the old offset $c_0$ and the correction vector f defined as described above, it is possible, regardless of the distribution of the data set of statistical population, to derive the new offset while estimating that a magnetic data set distributed in a principle axis direction with larger dispersion is more significant elements of statistical population and a magnetic data set distributed in a principle axis direction with smaller dispersion is less significant elements of statistical population. One example technique for deriving the new offset in this manner is to formulate the distribution as an optimization problem. No matter which operation for calibration the user performs, this device can derive the most probable new offset which can be derived from an actually performed operation and thus does not require the user to perform a predetermined operation.

In the inventive magnetic data processing device, the constraint condition may be that a weighting factor of the temporary position vector for the coefficient of the second fundamental vector in the principle axis direction corresponding to a smaller one of the principle values be zero if a ratio of the smaller principle value to a larger one of the principle values is equal to or less than a predetermined threshold.

This device discretely estimates the distribution of the data set of statistical population and discretely weights the coefficients of the position vector of the temporary offset relative to the old offset $c_0$ according to the discrete estimation result. Specifically, the weight of the coefficient of the temporary position vector g in the direction in which the value of the distribution is relatively small is "0". That is, no data set of statistical population is estimated in the direction in which the value of the distribution is smaller than a threshold.

In the inventive magnetic data processing device, the constraint condition may be that the coefficients of the correction vector be values obtained by weighting the coefficients of the temporary position vector by weighting factors continuously corresponding to the ratios of the principle values of the distribution of the data set of statistical population.

This device can increase the substantial use efficiency of the data set of statistical population since the weighting factors have a continuous association with the distribution. In addition, the device can simplify the offset update process since it is possible to derive the new offset without changing the process according to the distribution of the data set of statistical population.

In the inventive magnetic data processing device, the respective weighting factors for the coefficients of the temporary position vector may be normalized by setting, to one, the weighting factor for the coefficient of the second fundamental vector in the principle axis direction corresponding to the larger principle value.

In the case where estimation indicators of the distribution of the data set of statistical population other than the principle values of the distribution are introduced, it is not necessary to normalize the weighting factors by setting the larger weighting factor to one. For example, the maximum weighting factor may be set to less than one according to the ratio of the maximum distance between magnetic data in a principle axis direction (i.e., the principle direction) corresponding to the larger principle value to the radius of a circle that has been derived as a circumference, having a portion near which a data set of statistical population is distributed, based on the data set of statistical population.

In the inventive magnetic data processing device for accomplishing the above object, the offset derivation part may derive "c" that minimizes the following objective function f(c) under the constraint condition:

$f(c)=(Xc-j)^T(Xc-j)$, where "X" and "j" are as follows when the magnetic data is represented by $q_i=(q_{ix},q_{iy})$ (i=0,1,2, ... ):

$$X = \begin{bmatrix} (q_0 - \bar{q})^T \\ (q_1 - \bar{q})^T \\ (q_2 - \bar{q})^T \\ \cdots \\ (q_{N-1} - \bar{q})^T \end{bmatrix} \quad j = \frac{1}{2} \begin{bmatrix} q_0^T q_0 - R \\ q_1^T q_1 - R \\ q_2^T q_2 - R \\ \cdots \\ q_{N-1}^T q_{N-1} - R \end{bmatrix}.$$

In this specification, all vectors are column vectors and row vectors are expressed as transposed matrices of column vectors. A symbol "T" is attached to each transposed matrix at the right upper or shoulder side thereof [i.e., in the form of $(\ )^T$].

Since this device derives a new offset as an optimization problem of the distribution with a constraint condition, it is possible to derive the new offset, for example, by solving simple simultaneous linear equations as described later in the embodiments. That is, no matter what the distribution of the data set of statistical population is, it is possible for this device to derive, through a simple process, the most probable new offset which can be derived from the data set of statistical population.

The function of each of the plurality of parts included in the device of the present invention is realized by a hardware resource, the function of which is specified by its construction, a hardware resource, the function of which is specified by a program, or a combination of these resources. The function of each of the plurality of part a is not necessarily realized by a physically independent hardware resource. The present invention can be specified not only by a device but also by a program, a recording medium on which the program is recorded, and a method. The operations of the method described in the claims are not necessarily performed in the order as described in the claims and may be performed in any other order or at the same time, provided there is no technical impediment.

Embodiments of the first aspect of the present invention will be described in the following order.

A. FIRST EMBODIMENT

Figure 2:
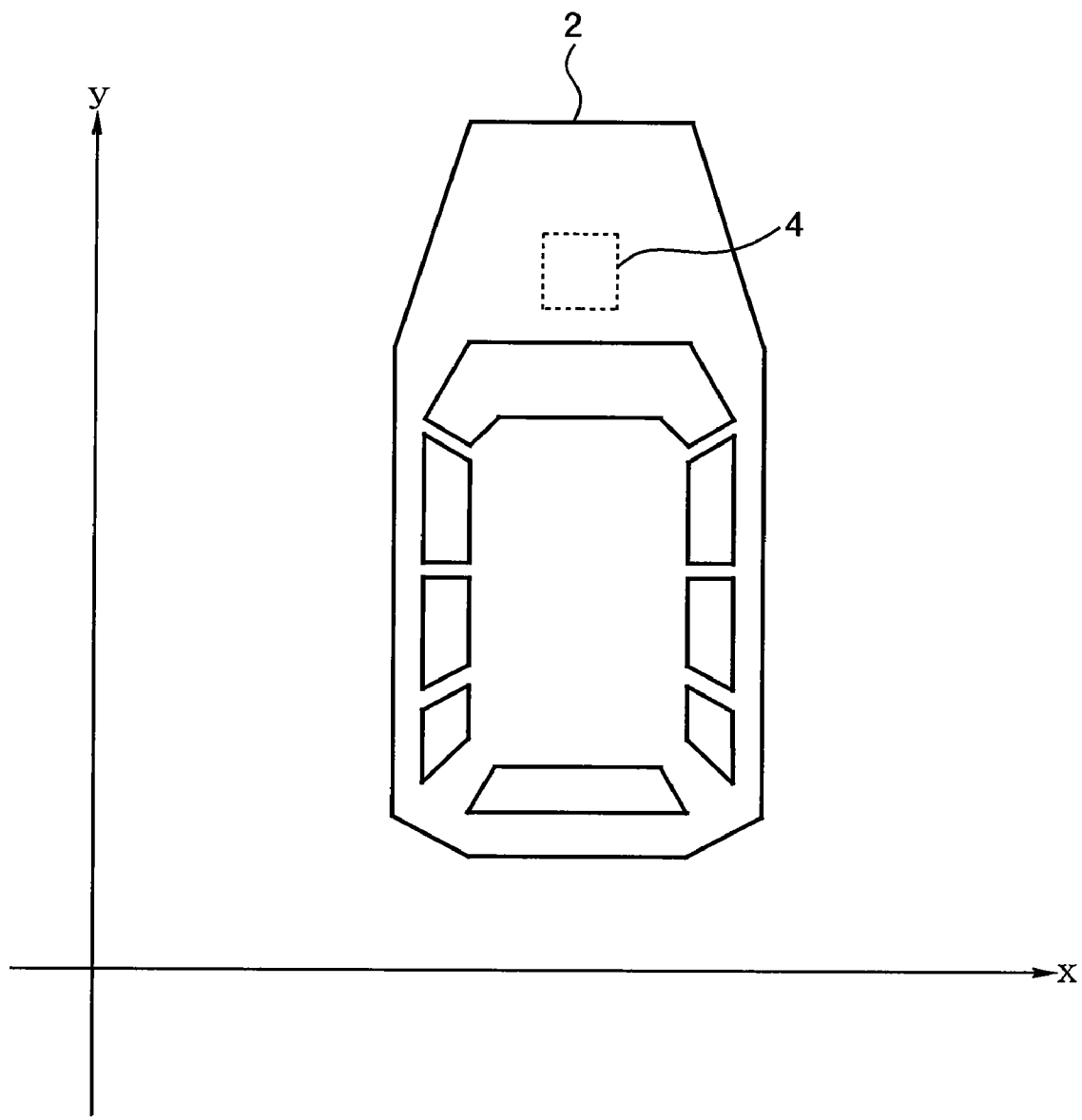
FIG. 2 is a schematic diagram of the embodiments of the first aspect of the present invention.

[1. General Description]
1-1. Hardware Structure
1-2. Software Structure
[2. Procedure]
2-1. Overall Flow
2-2. Buffer Update
2-3. Estimation of Distribution
2-4. Derivation of New Offset through Optimization Problem
2-5. Derivation of New Offset when the Distribution is Two-Dimensional
2-6. Derivation of New Offset when the Distribution is Substantially One-Dimensional
2-7. Summary
B. Second Embodiment
Overview
Estimation of Distribution
Derivation of New Offset
C. Other Embodiments
[General Description]
1-1. Hardware Structure FIG. 2 is a schematic diagram of an external appearance of an automobile 2 that is an example of a moving body to which the present invention is applied. The automobile 2 includes a 2-dimensional (2D) magnetic sensor 4. The 2D magnetic sensor 4 detects the direction and intensity of a magnetic field by detecting respective intensities of the magnetic field in two orthogonal directions (x, y). The 2D magnetic sensor 4, which constitutes a part of a navigation system mounted on the automobile 2, is used to specify the travel direction of the automobile 2.

Figure 3:
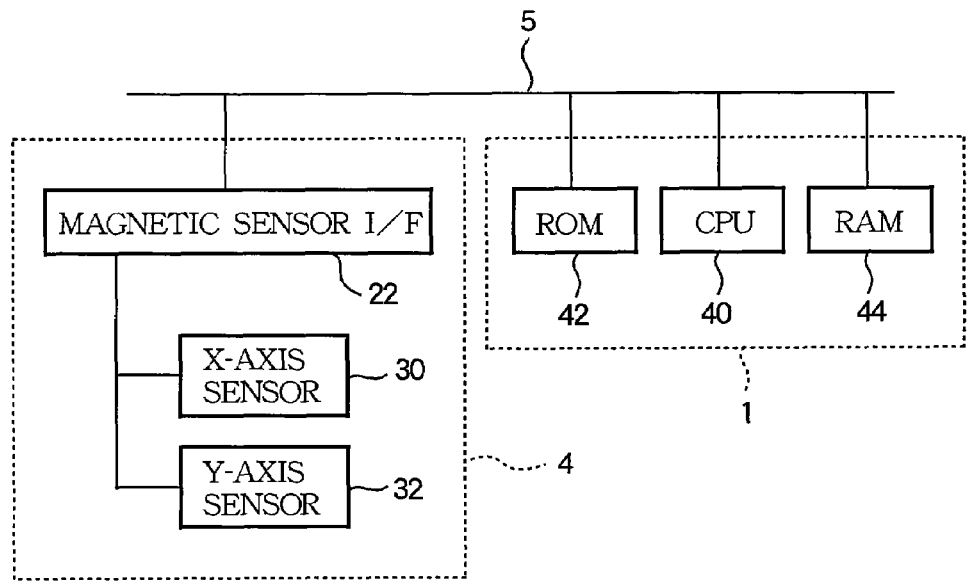
FIG. 3 is a block diagram of the embodiments of the first aspect of the present invention.

FIG. 3 is a block diagram of a magnetic measurement device which includes a 2D magnetic sensor 4 and a magnetic data processing device 1. The 2D magnetic sensor 4 includes x and y-axis sensors 30 and 32 that detect x and y direction components of a magnetic field vector due to terrestrial magnetism. Each of the x and y-axis sensors 30 and 32 includes a magnetic resistance element, a hall sensor, or the like, which may be any type of 1-dimensional magnetic sensor provided that it has directivity. The x and y-axis sensors 30 and 32 are fixed so that their sensitive directions are perpendicular to each other. Outputs of the x and y-axis sensors 30 and 32 are time-divided and input to a magnetic sensor interface (I/F) 22. The magnetic sensor interface 22 analog-to-digital converts inputs from the x and y-axis sensors 30 and 32 after amplifying the inputs. Digital magnetic data output from the magnetic sensor interface 22 is input to the magnetic data processing device 1 through a bus 5.

The magnetic data processing device 1 is a computer including a CPU 40, a ROM 42, and a RAM 44. The CPU 40 controls overall operations of, for example, the navigation system. The ROM 42 is a nonvolatile storage medium which stores a magnetic data processing program or a variety of programs used to implement functions of the navigation system, which are executed by the CPU 40. The RAM 44 is a volatile storage medium which temporarily stores data to be processed by the CPU 40. The magnetic data processing device 1 and the 2D magnetic sensor 4 may be constructed as a one-chip magnetic measurement device.

1-2. Software Structure

Figure 4:
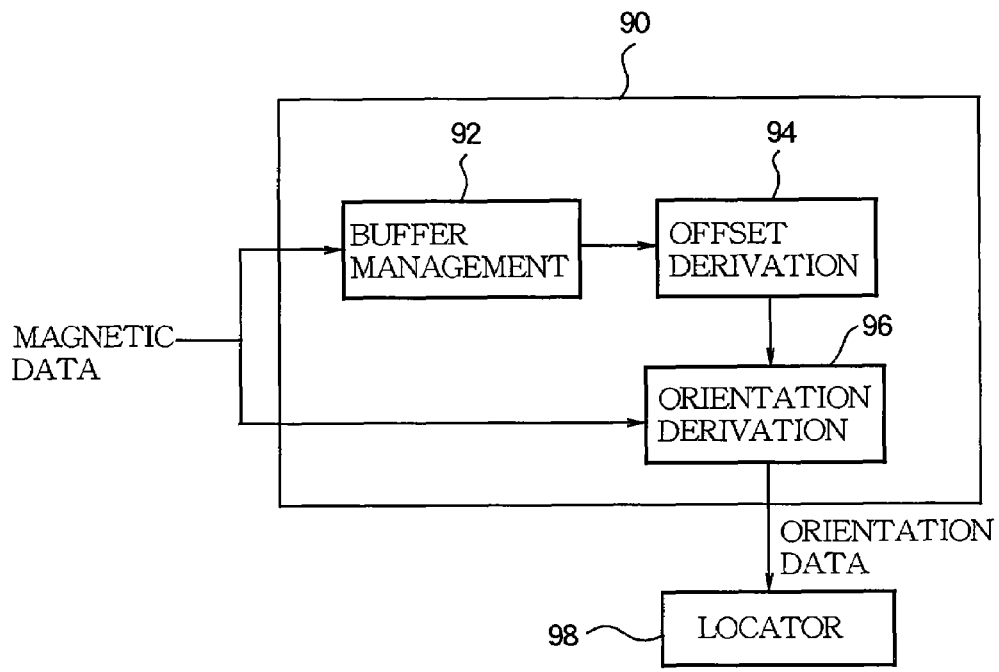
FIG. 4 is a block diagram of the embodiments of the first aspect of the present invention.

FIG. 4 is a block diagram of a magnetic data processing program 90. The magnetic data processing program 90 is stored in the ROM 42 to provide orientation data to a locator 98. The orientation data is 2D vector data representing the orientation of the Earth's magnetic field.

The magnetic data processing program 90 is constructed as a group of modules such as a buffer management module 92, an offset derivation module 94, and an orientation derivation module 96.

The buffer management module 92 is a program part that receives a plurality of magnetic data sequentially output from the magnetic sensor 4 and stores the received magnetic data in a buffer in order to use the magnetic data in offset update. The buffer management module 92 allows the CPU 40, the RAM 44, and the ROM 42 to function as an input part and storage part. This buffer may be embodied not only in hardware but also in software. A magnetic data set stored in this buffer will now be referred to as a data set of statistical population.

The offset derivation module 94 is a program part that derives a new offset based on a data set of statistical population held by the buffer management module 92 and an old offset held by the offset derivation module 94 and updates the old offset with the new offset. The offset derivation module 94 allows the CPU 40, the RAM 44, and the ROM 42 to function as an offset derivation part. Since updating the old offset with the new offset causes the new offset to become an old offset, the "old offset" will be referred to simply as an "offset" in context in which it causes no misunderstanding. Actually, an offset used for orientation data correction is set in one variable and the new offset is derived as a different variable from that variable. When the new offset is derived, it is set in the variable used for orientation data correction. Therefore, the variable used for orientation data correction is that in which the old offset is stored.

The orientation derivation module 96 is a program part that corrects the magnetic data sequentially output from the magnetic sensor using the offset held by the offset derivation module 94 to create orientation data.

Specifically, the orientation derivation module 96 outputs, as orientation data, data including 2 components obtained by subtracting the components of the offset from the components of the magnetic data which is 2D vector data.

The locator 98 is a known program that specifies the current position of the automobile 2 through autonomous navigation. Specifically, the locator 98 specifies the travel direction of the automobile 2 based on the orientation data and specifies the position of the automobile 2 relative to a base point based on both the travel direction and the travel distance. The orientation data may be used only to display north, south, east and west by characters or arrows on the screen and may also be used for heading-map processing of the map displayed on the screen.

[2. Procedure]

2-1. Overall Flow

Figure 5:
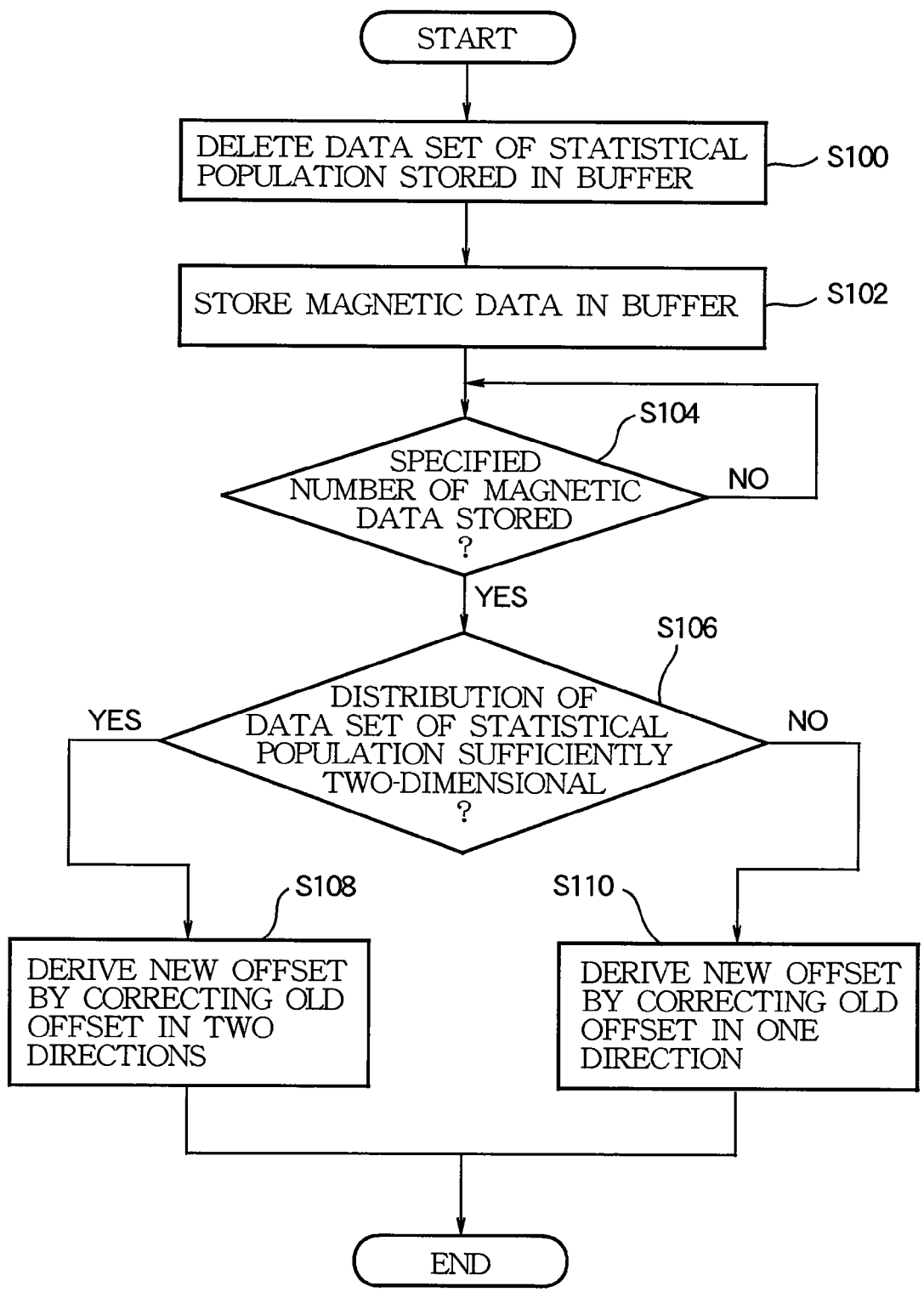
FIG. 5 is a flow chart of the first embodiment of the first aspect of the present invention.

FIG. 5 is a flow chart illustrating a new offset derivation procedure. The CPU 40 performs the procedure of FIG. 5 by executing the buffer management module and the offset derivation module 94 when an offset update request has been made. The offset update request may be made at predetermined time intervals and may also be made by an explicit instruction of the driver.

2-2. Buffer Update

At step S100, all magnetic data stored in the buffer, in which a magnetic data set (data set of statistical population) used for deriving a new offset is stored, is deleted. As a result, in this process, a data set of statistical population used for deriving the old offset is deleted.

At step S102, magnetic data used for deriving a new offset is input and stored in the buffer. When a plurality of magnetic data is sequentially input from the magnetic sensor 4 with almost no change in the travel direction of the automobile 2, the distance between two sequentially input magnetic data (or values) is small. Storing a plurality of near magnetic data in a buffer with a limited capacity wastes memory resources and causes unnecessary buffer update processes. In addition, if a new offset is derived based on a set of near magnetic data, there is a possibility that an inaccurate new offset is derived based on an unevenly distributed data set of statistical population. Whether or not it is necessary to update the buffer may be determined in the following manner. For example, if the distance between the last input magnetic data and magnetic data stored in the buffer immediately before the last input magnetic data is less than a given threshold, it is determined that it is unnecessary to update the buffer and the last input magnetic data is discarded without being stored in the buffer.

At step S104, it is determined whether or not a specified number of magnetic data required to derive an accurate new offset has been stored in the buffer. That is, the number of elements of the data set of statistical population is predetermined. Setting a small number of elements of the data set of statistical population improves response to the offset update request. The processes of steps S102 and S104 are repeated until the specified number of magnetic data is stored in the buffer.

2-3. Estimation of Distribution

Once the specified number of magnetic data is stored in the buffer, the distribution of the data set of statistical population is estimated (S106). The distribution is estimated based on principle values of the distribution. When the magnetic data set is expressed by the following Equation (1), the principle values of the distribution are eigenvalues of a symmetric matrix A defined by Equations (2), (3), and (4) using the sum of vectors starting from a center (average) of the data set of statistical population and ending with the respective magnetic data.

$$q_i = (q_{ix}, q_{iy}) \, (i = 0, 1, 2, \ldots) \quad (1)$$

$$A = X^T X \quad (2)$$

where $$X = \begin{bmatrix} (q_0 - \bar{q})^T \\ (q_1 - \bar{q})^T \\ (q_2 - \bar{q})^T \\ \ldots \\ (q_{N-1} - \bar{q})^T \end{bmatrix} \quad (3)$$

$$\bar{q} = \frac{1}{N} \sum_{i=0}^{N-1} q_i \quad (4)$$

As the matrix A may also be rewritten as Equation (5), the matrix A corresponds to N times a variance-covariance matrix.

$$A = \sum_{i=0}^{N-1} (q_i - \bar{q})(q_i - \bar{q})^T \quad (5)$$

Let $\lambda_1$ and $\lambda_2$ be the eigenvalues of the matrix A in increasing order. Let $u_1$ and $u_2$ be mutually orthogonal eigenvectors that correspond to $\lambda_1$ and $\lambda_2$ and have been normalized to size 1. In this embodiment, it is assumed that the matrix A is nonsingular and the ranges of $\lambda_1$ and $\lambda_2$ are $\lambda_1 > 0$ and $\lambda_2 > 0$. When the smaller eigenvalue $\lambda_2$ of the matrix A is zero, i.e., when the rank of the matrix A is one or less, there is no need to consider it since the number of elements of the data set of statistical population is one or the distribution is a perfectly straight line. Each of the eigenvalues must be zero or a positive real number since the matrix A is a positive semi-definite matrix from its definition.

The distribution of the data set of statistical population is estimated based on the ratio $\lambda_2/\lambda_1$ of the smaller eigenvalue to the larger eigenvalue.

At step S106, it is determined whether or not the distribution of the data set of statistical population is sufficiently two-dimensional. Specifically, the determination is affirmative when the following condition (6) is satisfied and negative when it is not satisfied.

$$\lambda_2/\lambda_1 > t \quad (6)$$

The condition (6) is satisfied when the data set of statistical population is distributed over a wide range along a specific circumference.

If the determination of step S106 is negative, the distribution of the data set of statistical population is substantially one-dimensional. When the data set of statistical population is unevenly distributed over a narrow central-angle arc of the specific circumference, the distribution of the data set of statistical population is substantially one-dimensional.

2-4. Derivation of New Offset through Optimization Problem

An optimization problem for deriving a new offset will now be described.

When the data set of statistical population includes 3 magnetic data not present on the same line, a circumference on which the data set of statistical population is distributed is uniquely specified without using a statistical technique. A position vector $c = (c_x, c_y)$ of the center of this circumference is obtained by solving simultaneous equations (7). Although three equality constraints exist for two variables, the equations (7) must have a solution since one of the three equality constraints is redundant.

$$\begin{bmatrix} (q_0 - \bar{q})^T \\ (q_1 - \bar{q})^T \\ (q_2 - \bar{q})^T \end{bmatrix} c = \frac{1}{2} \begin{bmatrix} q_0^T q_0 - R \\ q_1^T q_1 - R \\ q_2^T q_2 - R \end{bmatrix} \quad (7)$$

where $$R = \frac{1}{N} \sum_{i=0}^{N-1} q_i^T q_i \quad (8)$$

When the number of elements of the data set of statistical population is 4 or more, "j" is defined by the following equation (9).

$$j = \frac{1}{2} \begin{bmatrix} q_0^T q_0 - R \\ q_1^T q_1 - R \\ q_2^T q_2 - R \\ \ldots \\ q_{N-1}^T q_{N-1} - R \end{bmatrix} \quad (9)$$

Here, if simultaneous linear equations (10) for "c" have a solution, the solution is the center of a circumference on which the data set of statistical population is distributed.

$$Xc = j \quad (10)$$

However, if an inherent measurement error of the 2D magnetic sensor 4 is considered, it is practically impossible for Equations (10) to have a solution. A vector "e" defined by the following equation (11) is introduced to obtain a plausible solution through a statistical technique.

$$e = Xc - j \quad (11)$$

"c" which minimizes $\|e\|_2^2$ (that is, $e^T e$) can be considered to be plausible as the center of a circumference closest to the distribution of the data set of statistical population. A problem for finding the value "c" minimizing $\|e\|_2^2$ is an optimization problem for minimizing an objective function of the following equation (12) when the matrix A is nonsingular.

$$f(c) = (Xc - j)^T (Xc - j) \quad (12)$$

2-5. Derivation of New Offset when the Distribution is Two-Dimensional

Figure 6:
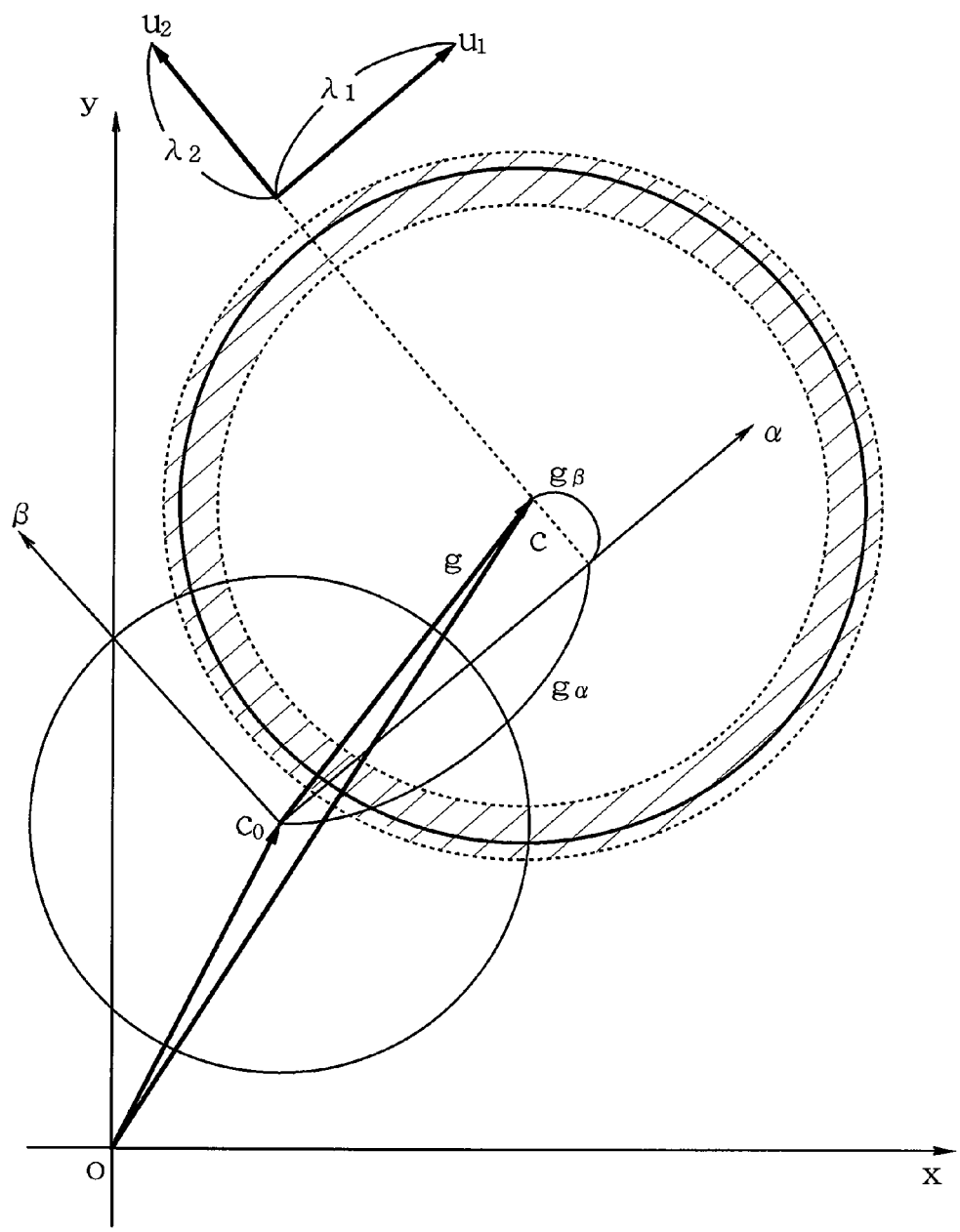
FIG. 6 is a schematic diagram of the first embodiment of the first aspect of the present invention.
Figure 6:

When the distribution of the data set of statistical population is two-dimensional as shown in FIG. 6, the data set of statistical population is sufficiently reliable in its entirety and therefore a new offset is derived by obtaining "c" which minimizes the objective function f(c) of Equation (12) without any constraint condition (S108). The value "c" which minimizes the objective function f(c) without any constraint condition can be written as Equation (13) when $X^T X$ assumed in this embodiment is nonsingular.

$$c = (X^T X)^{-1} X^T j \quad (13)$$

When "c" satisfying Equation (13) has been derived, a new offset, which can be obtained by correcting the old offset in two directions, is derived based on the data set of statistical population without using the old offset.

When the data set of statistical population is sufficiently two-dimensional, it is unnecessary to use the old offset when deriving the new offset. An algorithm for deriving a new offset based on the data set of statistical population without using the old offset may be an algorithm that, as in this embodiment, uses one of a variety of statistical techniques which have been suggested and may also be an algorithm that uses no statistical technique.

Figure 7:
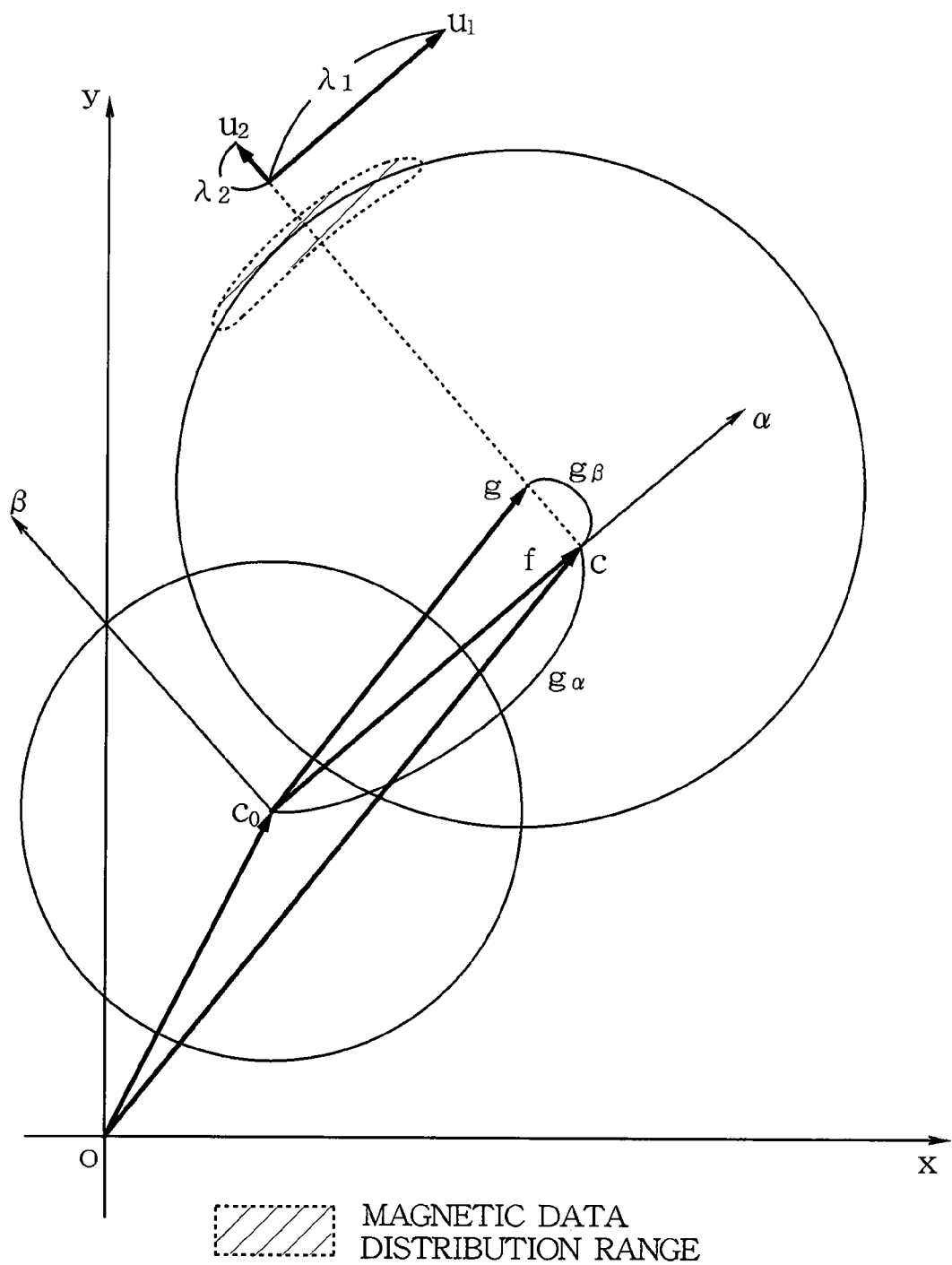
FIG. 7 is a schematic diagram of the first embodiment of the first aspect of the present invention.

2-6. Derivation of New Offset when the Distribution is Substantially One-Dimensional As shown in FIG. 7, when the data set of statistical population is distributed over a narrow central-angle arc of the specific circumference and thus the distribution of the data set of statistical population is substantially one-dimensional (i.e., linear), a new offset is derived by restricting directions in which the old offset is corrected to one principle direction of the distribution (S110). When the data set of statistical population is distributed near a specific line, the distribution of the data set of statistical population in the direction of the line is sufficiently reliable while the distribution of the data set of statistical population in other directions is unreliable. In this case, the old offset is not corrected in directions other than the direction of the line, thereby preventing the offset from being updated based on unreliable information.

When the data set of statistical population is distributed near a specific line, the direction of the line is coincident with the direction (i.e., principle direction) of an eigenvector $u_1$ corresponding to the larger eigenvalue $\lambda_1$ and the direction of an eigenvector $u_2$ corresponding to the smaller eigenvalue $\lambda_2$ is perpendicular to the line. Accordingly, in order to derive a new offset only in the direction of the line, a new offset c which minimizes the objective function of Equation (12) is found under a constraint condition expressed by the following equation (14).

$$u_2^T (c - c_0) = 0 \quad (14)$$

The equation for solving the optimization problem of Equation (12) under the constraint condition of Equation (14) can be modified to its equivalent simultaneous equations using the method of Lagrange multipliers. When an unknown constant multiplier ρ is introduced and "x" is defined by the following equation (15), simultaneous linear equations (16) of "x" are the above-mentioned simultaneous equations.

$$x = \begin{bmatrix} c \\ \rho \end{bmatrix} \quad (15)$$

$$B_3 x = b_3 \quad (16)$$

where $$B_3 = \begin{bmatrix} A & u_2 \\ u_2^T & 0 \end{bmatrix} \quad (17)$$

$$b_3 = \begin{bmatrix} X^T j \\ u_2^T c_0 \end{bmatrix} \quad (18)$$

As can be understood from the above description, if the distribution of the data set of statistical population is substantially one-dimensional, the process for deriving the new offset at step S110 is to solve the simultaneous linear equations (16). The solution "x" must be uniquely specified since the rank of the matrix $B_3$ must be 3.

2-7. Summary

The processes of steps S108 and S110 will now be described using spatial concepts with reference to FIGS. 6 and 7. If it is assumed that the data set of statistical population is completely reliable, the new offset c is defined by the following equation (19) by considering the new offset c as the sum of the old offset $c_0$ and a position vector (i.e., temporary position vector) g of the center of a circumference, derived from only the data set of statistical population, relative to the old offset $c_0$.

$$c = c_0 + g \tag{19}$$

The position vector "c" of the new offset can be considered to be the sum of the old offset "$c_0$" and a correction vector "f" which is a linear combination of fundamental vectors in the same directions as the eigenvectors $u_1$ and $u_2$ of the distribution. Therefore, the correction vector "f", which corresponds to a vector corrected from the position vector "g" according to the respective degrees of reliability of the components of the position vector "g" corresponding to the center of the data set of statistical population, can be obtained by weighting coefficients $g_\alpha$ and $g_\beta$ of the position vector "g" according to the respective degrees of reliability of the data set of statistical population in the corresponding principle axis directions.

In the process of step S108 which is performed when the distribution of the data set of statistical population is sufficiently two-dimensional as shown in FIG. 6, "c" which minimizes the objective function of Equation (12) is obtained without any constraint condition as described above.

However, it can be considered that this process is performed under a constraint condition that the new offset "c" be obtained as the sum of the old offset $c_0$ and the correction vector "f" that is obtained by weighting both the components $g_\alpha$ and $g_\beta$ of the temporary position vector "g" in two principle axis directions of the distribution by a weighting factor of "1". In FIG. 6, the correction vector "f" is not shown since it is coincident with the position vector "g".

In the process of step S110 which is performed when the distribution of the data set of statistical population is substantially one-dimensional as shown in FIG. 7, the following constraint condition is imposed when deriving a new offset based on the old offset $c_0$ and the data set of statistical population. The constraint condition is that the new offset c be obtained as the sum of the old offset $c_0$ and a correction vector "f" that is obtained by weighting a coefficient $g_\alpha$ of the temporary position vector "g" in a principle axis direction (or a principle direction) of the distribution corresponding to the larger principle value of the distribution (i.e., corresponding to the larger eigenvalue $\lambda_1$) by a weighting factor of "1" of the temporary position vector "g" and weighting a coefficient $g_\beta$ in a principle axis direction of the distribution corresponding to the smaller principle value of the distribution (i.e., corresponding to the smaller eigenvalue $\lambda_2$) by a weighting factor of "0" of the position vector "g".

The key point of the algorithm in this embodiment is that "c" which minimizes the objective function of Equation (12) is obtained under a constraint condition that weighting factors for both the components of the temporary position vector "g" are set to "1" if the ratio between principle values of the distribution of the data set of statistical population is greater than a predetermined threshold "t" and a weighting factor for the component of the temporary position vector "g" in the principle direction of the distribution is set to "1" and a weighting factor for the component of the temporary position vector "g" in a principle axis direction of the distribution with a smaller level of distribution is set to "0" if the ratio between principle values of the distribution of the data set of statistical population is less than or equal to the predetermined threshold "t".

B. SECOND EMBODIMENT

Overview

In the first embodiment, the distribution of the data set of statistical population is estimated discretely and the new offset "c" is derived using different techniques when the distribution is sufficiently two-dimensional and when the distribution is substantially one-dimensional. In the second embodiment, a description will be given of a simple, highly accurate algorithm that can eliminate the need to perform different processes according to estimations of the distribution as in the first embodiment and can also derive a more probable new offset by efficiently using the data set of statistical population.

Figure 8:
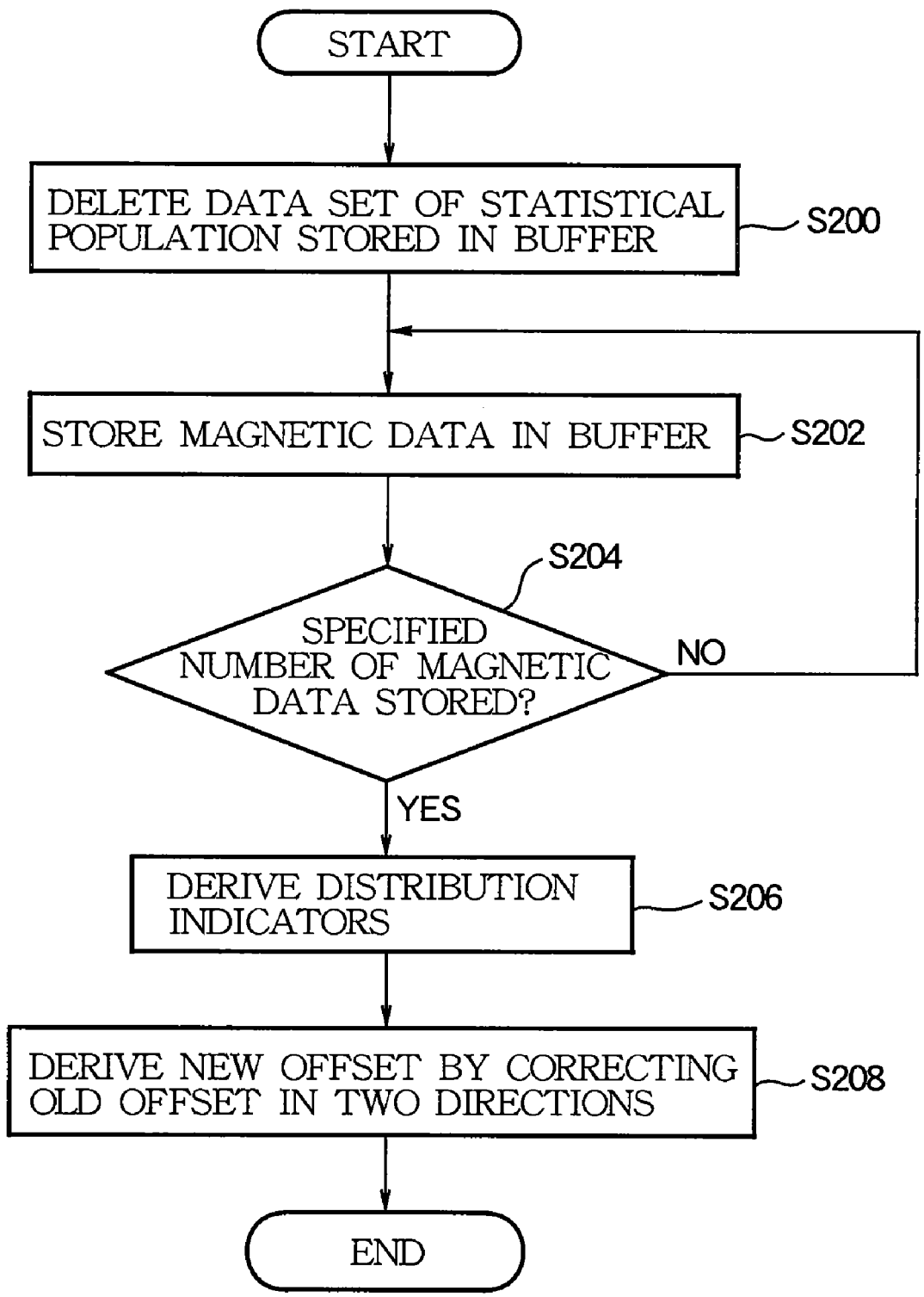
FIG. 8 is a flow chart of the second embodiment of the first aspect of the present invention.

FIG. 8 is a flow chart illustrating a new offset derivation process. In the same manner as in the first embodiment, the CPU 40 performs the procedure of FIG. 8 by executing the offset derivation module 94 when an offset update request has been made. The process of step S200 is the same as that of the process of step S100 described above in the first embodiment. The process of step S202 is the same as that of the process of step S102 described above in the first embodiment. The process of step S204 is the same as that of the process of step S104 described above in the first embodiment.

Estimation of Distribution

At step S206, a distribution indicator of the data set of statistical population is derived. Specifically, the distribution of the data set of statistical population is estimated as continuous values by deriving, as a distribution indicator, $m_2$ defined by the following equation (20).

$$m_2 = 1 - \left(\frac{\lambda_2}{\lambda_1}\right)^{k_2} \tag{20}$$

Here, "$k_2$" is a predetermined positive constant number.

The value of $k_2$ determines the association between principle values and the degrees of reliability of the corresponding principle axis directions of the data set of statistical population. Here, "$m_2$" must satisfy the following condition (21).

$$0 \leq m_2 < 1 \tag{21}$$

The spatial concept of $m_2$ will now be described with reference to FIG. 1. When the coefficients of the components of the temporary position vector g in the principle axis directions of the distribution are denoted by $g_\alpha$ and $g_\beta$ in decreasing order of the corresponding principle values and the coefficients of the components of the position vector f in the principle axis directions of the distribution are denoted by $f_\alpha$ and $f_\beta$ in decreasing order of the corresponding principle values, the relationships between the temporary position vector g, the correction vector f, and $m_2$ in this embodiment are expressed by the following equations (22) and (23).

$$\frac{f_\alpha}{g_\alpha} = 1 \tag{22}$$

$$\frac{f_\beta}{g_\beta} = \frac{\left(\frac{\lambda_2}{\lambda_1}\right)m_2 - \left(\frac{\lambda_2}{\lambda_1}\right)}{\left(\frac{\lambda_2}{\lambda_1}\right)m_2 - \left(\frac{\lambda_2}{\lambda_1}\right) - m_2^2} \tag{23}$$

The weighting factor $f_\alpha/g_\alpha$ associated with the component of the principle axis direction corresponding to the maximum principle value may be set to be less than "1". In addition, if the following conditions are satisfied, any definition may be made for "$m_2$" determined such that the weighting factors continuously correspond to the ratios of principle values, without being limited to the definition of Equation (20).

The range of values of $m_2$ is [0,1] or its subset.

$m_2 \neq 1$ when $\lambda_2/\lambda_1 = 1$ $m_2 = 1$ when $\lambda_2/\lambda_1 = 0$ if $\lambda_2 = 0$ is permitted $m_2$ decreases monotonically in a broad sense as $\lambda_2/\lambda_1$ increases.

Specifically, $m_2$ may be defined, for example, by the following equation (24).

$$m_2 = \frac{1}{2} - \frac{1}{2}\mathrm{sgn}\left\{2\left(\frac{\lambda_2}{\lambda_1}\right)^s - 1\right\}\left|2\left(\frac{\lambda_2}{\lambda_1}\right)^s - 1\right|^k \quad (24)$$

where "s" and "k" are nonnegative real numbers and "sgn" is a sign function expressed by the following equation.

$$\mathrm{sgn}(x) = \begin{cases} 1 & (x > 0) \\ 0 & (x = 0) \\ -1 & (x < 0) \end{cases} \quad (25)$$

Since a very large amount of calculation is required to derive $m_2$ defined by Equation (24), calculation results of Equation (24) with inputs $\lambda_1$ and $\lambda_2$ may be stored in a 2D lookup table and an approximate value of $m_2$ may then be derived with reference to the 2D lookup table.

Figure 9:
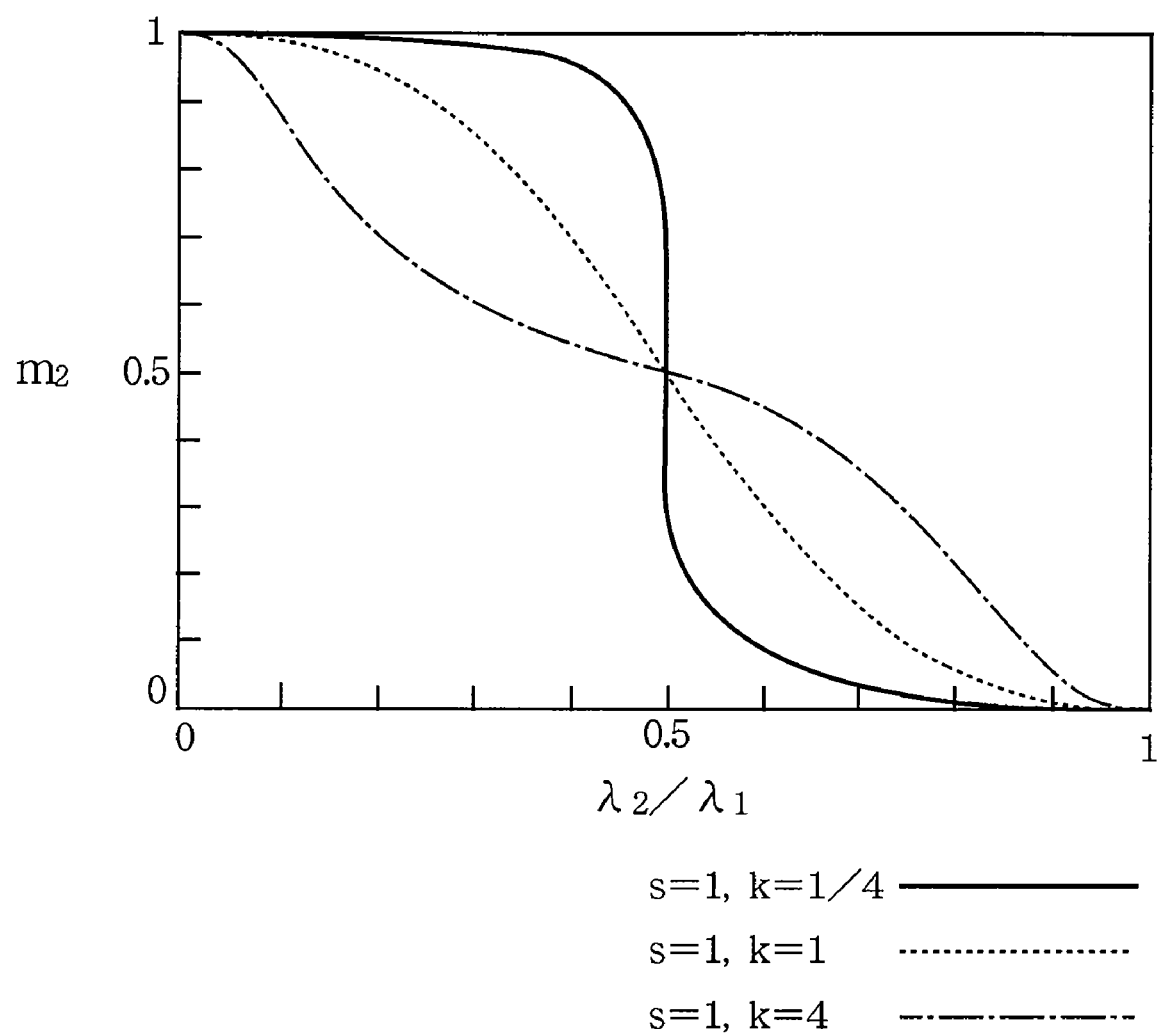
FIG. 9 is a graph associated with the second embodiment of the first aspect of the present invention.
Figure 10:
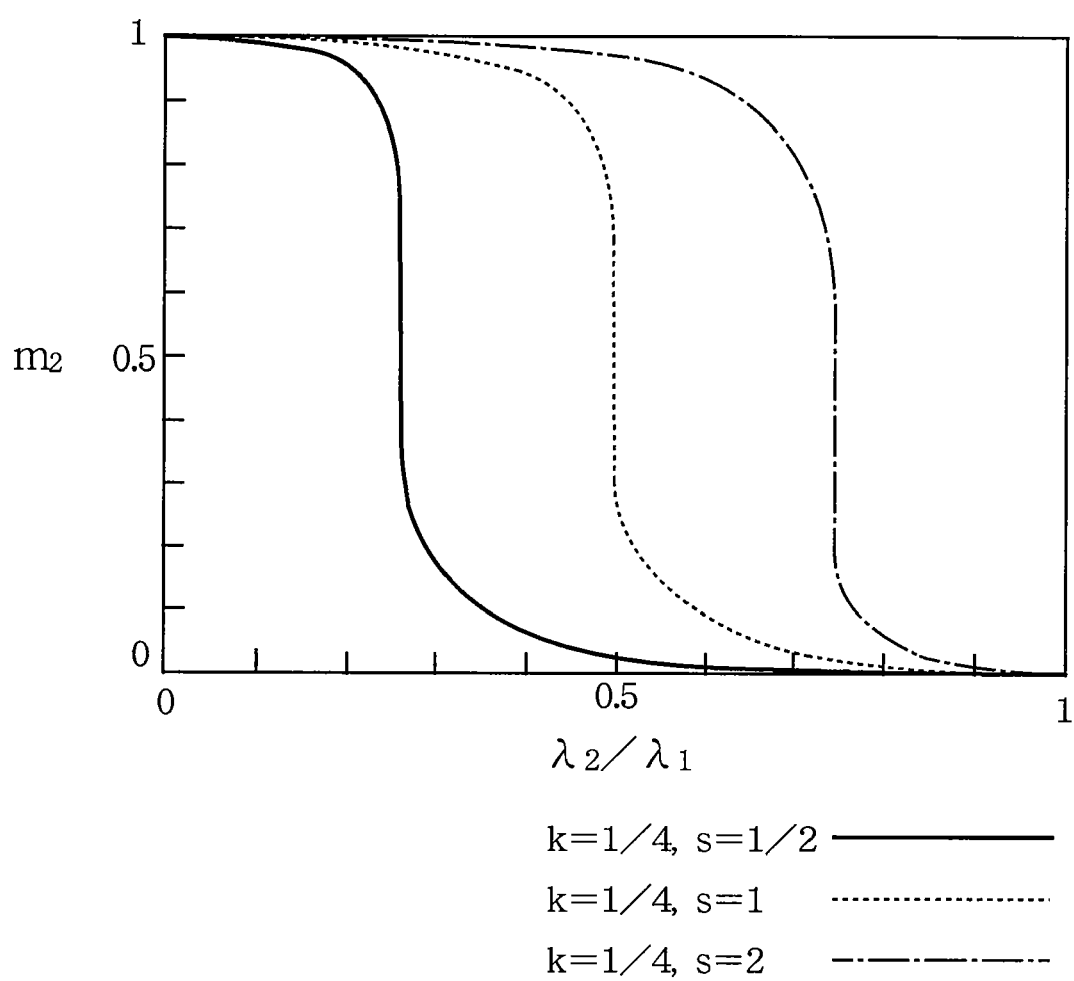
FIG. 10 is a graph associated with the second embodiment of the first aspect of the present invention.

The indices "s" and "k" are set depending on embodiments since weighting effects vary depending on their values. FIGS. 9 and 10 are graphs representing weighting effects that vary depending on the indices "s" and "k". FIG. 9 shows the relationship between the ratio of eigenvalues ($\lambda_2/\lambda_1$) and the weighting factor $m_2$ when "s" is fixed to 1 and "k" is set to ¼, 1, and 4 in Equation (24). FIG. 10 shows the relationship between the ratio of eigenvalues ($\lambda_2/\lambda_1$) and the weighting factor $m_2$ when "k" is fixed to ¼ and "s" is set to ½, 1, and 2 in Equation (24).

When a magnetic sensor is mounted on a moving body or object such as a mobile phone or a Personal Digital Assistant (PDA), the attitude or posture of which changes at a high angular speed or velocity, it can be expected that the distribution of a magnetic data set stored in a certain period of time will be relatively wide on average. In case that the distribution of the magnetic data is not so wide, the accuracy of the offset would be rather degraded if the offset correction is carried out by significantly evaluating the magnetic data group of the principal axis direction having the small principal value since such a magnetic data group has low reliability. Therefore, in case that the invention is applied to a moving object where the distribution of the magnetic data group tends to become relatively wide, the values of the parameters s and k should be set so that the magnetic data group of the principal axis direction having the small principal value is evaluated significantly only if the distribution of the magnetic data is considerably wide. Here, as the value of $m_2$ in the Equation (24) becomes smaller, it means that the weight in the principal axis direction of the distribution having the small principal value becomes greater. Consequently, in case that the Equation (24) is applied to a moving object which changes its posture at a fast angular velocity, it is desirable to set the parameter s with a relatively great value and set the parameter k with relatively small value.

On the other hand, when a magnetic sensor is mounted on a moving body or object such as an automobile, the attitude or posture of which changes at a low angular speed, it is assumed that the distribution of a magnetic data set stored in a certain period of time will be relatively narrow on average. In such a case, the accuracy of the offset would not be improved if the offset correction is carried out while the magnetic data group of the principal axis direction having the small principal value is not evaluated with a heavy weight although such a magnetic data group is not so reliable, when the distribution of the magnetic data is not so wide. Consequently, in case that the Equation (24) is applied to a moving object which changes its posture at a slow angular velocity, it is desirable to set the parameter s with a relatively small value and set the parameter k with relatively great value.

Derivation of New Offset

When it is difficult to derive a solution to the optimization problem under a specific constraint condition, a relaxation problem for solving the optimization problem by relaxing the constraint condition may be introduced. By applying this relaxation problem, this embodiment realizes a process for deriving a new offset c as the sum of the old offset $c_0$ and a correction vector f that is obtained by weighting the coefficients $g_\alpha$ and $g_\beta$ of the temporary position vector g (see FIG. 1) described above by weighting factors continuously corresponding to the ratios of principle values of the distribution of the data set of statistical population. The following are details of this process.

An unknown constant multiplier $\rho$ is defined as a variable required for calculations during the process and c and $\rho$ are grouped together into one vector "x" that is defined by the following equation (26).

$$x = \begin{bmatrix} c \\ \rho \end{bmatrix} \quad (26)$$

In addition, a matrix "B" is defined by Equation (27) and a vector "b" is defined by Equation (28).

$$B = \begin{bmatrix} A & m_2 u_2 \\ m_2 u_2^T & \frac{1}{\lambda_1}(m_2 - 1) \end{bmatrix} \quad (27)$$

$$b = \begin{bmatrix} X^T j \\ m_2 u_2^T c_0 \end{bmatrix} \quad (28)$$

The process for deriving a new offset at step S208 is to find a solution to the following simultaneous equations (29). The vector x is uniquely specified since the matrix B must be nonsingular.

$$Bx = b \quad (29)$$

Finding a solution to the simultaneous equations (29) is equivalent to solving the optimization problem for minimizing the objective function of Equation (12) under a constraint condition that a new offset be obtained as the sum of the old offset $c_0$ and a correction vector f whose components are values obtained by weighting the coefficients of the position vector g in the principle axis directions of the distribution corresponding to the principle values by factors $f_\alpha/g_\alpha$ and $f_\beta/g_\beta$ continuously corresponding to the ratios of principle values of the distribution of the data set of statistical population.

In the second embodiment, it is easy to develop or improve the offset derivation module 94 and the data size of the offset derivation module 94 is also decreased since there is no need to branch the new offset derivation process according to the distribution of the data set of statistical population as described above. In addition, the second embodiment increases the use efficiency with which the data set of statistical population is used by the offset derivation module 94 and also allows the orientation derivation module to correct magnetic data using the most probable offset since the old offset can be corrected in the principle axis directions of the distribution by distances continuously corresponding to the ratios of principle values of the data set of statistical population unless any of the principle values is zero.

C. OTHER EMBODIMENTS

The first aspect of the present invention is not limited to the above embodiments and various embodiments are possible without departing from the spirit of the present invention. For example, the first aspect of the present invention can also be applied to a magnetic sensor that is mounted on a PDA, a mobile phone, a two-wheeled motor vehicle, a ship, or the like.

Figure 11:
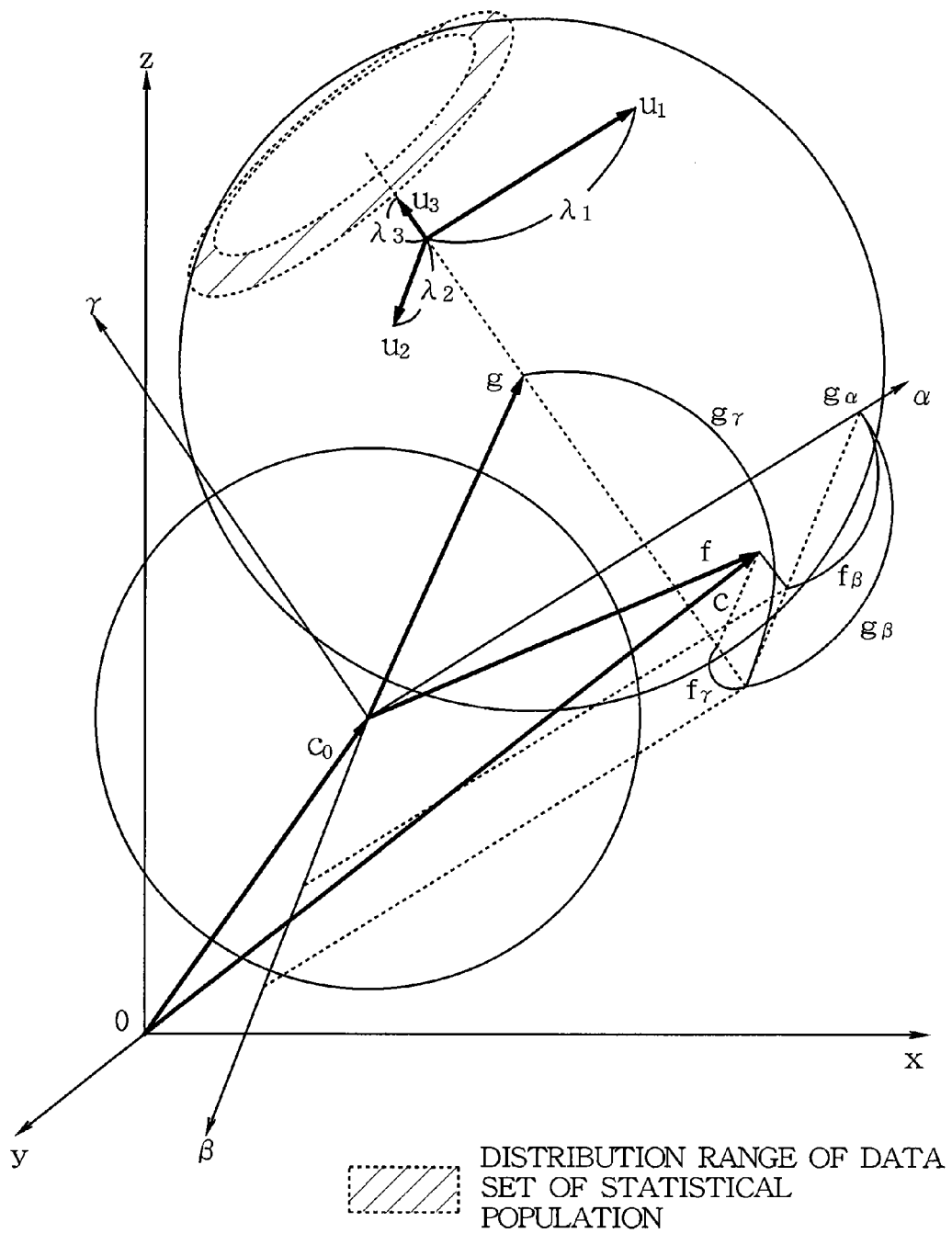
FIG. 11 is a schematic diagram of the embodiments of the second aspect of the present invention.

Next, a principle and algorithm used in the second aspect of the invention is described below in detail with reference to FIG. 11. Key points of this algorithm are that a magnetic data set distributed in a principle axis direction with larger dispersion is estimated to be more significant elements of statistical population for use in updating the offset and a magnetic data set distributed in a principle axis direction with smaller dispersion is estimated to be less significant elements of statistical population for use in updating the offset. Details are as follows. Each of the old offset $c_0$, the new offset c, and the temporary offset, which corresponds to the position of the end point of "g" relative to the point of origin "0", is 3D position vector data that is a linear combination of a fundamental vector set of magnetic data. That is, each of the offsets is vector data represented in the xyz coordinate system. The new offset c is derived based on the old offset $c_0$ and a magnetic data set that is stored to update the old offset $c_0$ with the new offset c.

The data set of statistical population, which is a magnetic data set stored to update the old offset with the new offset c, may include a magnetic data set that has been stored in a predetermined period of time and may include a magnetic data set including a predetermined number of magnetic data and may also include a magnetic data set including any number of magnetic data that has been stored at a certain time (for example, at the time when an offset update request is made).

The old offset $c_0$ may be derived using the same method as the new offset c and may also be predetermined.

Although the temporary offset is defined to be derived from the data set of statistical population without using the old offset $c_0$, this definition is introduced to define the constraint condition under which the new offset c is derived and the temporary offset is actually not data which it is necessary to derive. If the temporary offset is actually derived from the data set of statistical population without using the old offset $c_0$, the temporary offset is a position vector of the center of a spherical surface near which the data set of statistical population is distributed. However, if the data set of statistical population is unevenly distributed at a portion of the spherical surface derived from the data set of statistical population, an error included in each element of the data set of statistical population greatly affects the derivation result of the spherical surface and thus there is a possibility that a temporary offset distant from the true offset is derived. Let us consider, for example, that a data set of statistical population is distributed in doughnut-shaped distribution with mutually orthogonal eigenvectors $u_1$, $u_2$, and $u_3$ and the variance of the data set of statistical population is minimized in the direction of the eigenvector $u_3$ corresponding to the minimum principle value as shown in FIG. 11. In this case, since the variance of the data set of statistical population is small in the direction of the eigenvector $u_3$ of the distribution, there is a high probability that the position of a temporary offset derived from the data set of statistical population is distant from the position of the true offset in the direction of the eigenvector $u_3$. On the other hand, in this case, since the variance of the data set of statistical population is large in the direction of the eigenvector $u_1$ of the distribution, there is a high probability that the position of the temporary offset derived from the data set of statistical population is near the position of the true offset in the direction of the eigenvector $u_1$.

Since the variances in the principle axis directions of the distribution can be expressed using the principle values $\lambda_1$, $\lambda_2$, and $\lambda_3$ of the distribution as indicators of the distribution, this device estimates elements of statistical population distributed in the directions corresponding respectively to the principle values according to the ratios of the principle values $\lambda_1$, $\lambda_2$, and $\lambda_3$. Specifically, first, a correction vector f, which is a position vector of the new offset c relative to the old offset $c_0$, and a position vector g of the temporary offset relative to the old offset $c_0$ can be defined in a coordinate system having coordinate axes $\alpha$, $\beta$, and $\gamma$ coincident with the principle axis directions of the distribution. That is, each of the correction vector f and the position vector g can be defined to be a linear combination of fundamental vectors of the principle axis directions of the distribution. This corresponds to conversion into principle axis values. If the components $f_\alpha$, $f_\beta$, and $f_\gamma$ of the correction vector f are derived by weighting the components $g_\alpha$, $g_\beta$, and $g_\gamma$ of the position vector g of the temporary offset relative to the old offset $c_0$ according to the measures of the corresponding principle values $u_1$, $u_2$, and $u_3$ of the distribution, it is possible to derive the correction vector f by increasing the reliability of the elements of statistical population in directions with large dispersion and decreasing the reliability of the elements of statistical population in directions with small dispersion. However, such definitions of the correction vector f and the position vector g are also introduced to define the constraint condition under which the new offset c is derived and each of the correction vector f and the position vector g is actually not data which it is necessary to derive.

By deriving the new offset c under a constraint condition that the new offset c be obtained as the sum of the old offset $c_0$ and the correction vector f defined as described above, it is possible to derive the new offset while estimating that a magnetic data set distributed in a principle axis direction with larger dispersion is more significant elements of statistical population for use in updating the offset and a magnetic data set distributed in a principle axis direction with smaller dispersion is less significant elements of statistical population for use in updating the offset. One example technique for deriving the new offset in this manner is to formulate the distribution as an optimization problem. If a new offset is derived as an optimization problem of the distribution with a constraint condition, the new offset can be derived by solving simple simultaneous linear equations as described later in the embodiments. That is, no matter what the distribution of the data set of statistical population is, it is possible for this device to derive, through a simple process, the most probable new offset which can be derived from the data set of statistical population.

In the inventive magnetic data processing device, the constraint condition may be that a weighting factor of the position vector for the coefficient of one of the second fundamental vectors in one of the principle axis directions corresponding to a minimum one of the principle values be zero if a ratio of an intermediate one of the principle values to a maximum one of the principle values is higher than a first threshold and a ratio of the minimum principle value to the maximum principle value is equal to or less than a second threshold and that respective weighting factors of the position vector for both the coefficient of the second fundamental vector in the principle axis direction corresponding to the minimum principle value and the coefficient of another of the second fundamental vectors in one of the principle axis directions corresponding to the intermediate principle value be zero if the ratio of the intermediate principle value to the maximum principle value is equal to or less than the first threshold and the ratio of the minimum principle value to the maximum principle value is equal to or less than the second threshold.

This device discretely estimates the distribution of the data set of statistical population and discretely weights the coefficients of the position vector of the temporary offset relative to the old offset $c_0$ according to the discrete estimation result. Specifically, the weight of the coefficient of the position vector g in the direction in which the value of the distribution is the minimum value is "0". Also the weight of the coefficient of the position vector g in the direction in which the value of the distribution is the intermediate value is "0" if the value of the distribution is small in the direction. That is, no magnetic data is estimated in directions in which the value of the distribution is smaller than a threshold.

In the inventive magnetic data processing device, the constraint condition may be that the coefficients of the correction vector be values obtained by weighting the coefficients of the position vector by weighting factors continuously corresponding to the ratios of the principle values of the distribution of the data set of statistical population.

This device can increase the substantial use efficiency of the data set of statistical population since the weighting factors have a continuous association with the distribution. In addition, the device can simplify the offset update process since it is possible to derive the new offset without changing the process according to the distribution of the data set of statistical population.

In the inventive magnetic sensor offset derivation device, the respective weighting factors for the coefficients of the position vector may be normalized by setting, to one, the weighting factor for the coefficient of the second fundamental vector in the principle axis direction corresponding to the maximum principle value.

In the case where estimation indicators of the distribution of the magnetic data set of statistical population other than the principle values of the distribution are introduced, it is not necessary to normalize the weighting factors by setting the maximum weighting factor to one. For example, the maximum weighting factor may be set to less than one according to the ratio of the maximum distance between magnetic data in a principle axis direction (i.e., the principle direction) corresponding to the maximum principle value to the radius of a sphere that has been derived as a spherical surface, having a portion near which a magnetic data set of statistical population is distributed, based on the magnetic data set of statistical population.

In the inventive magnetic data processing device, the offset derivation part may derive "c" that minimizes the following objective function f(c) under the constraint condition:

$$f(c) = (Xc-j)^T(Xc-j)$$

where "X" and "j" are as follows when the magnetic data is represented by $q_i = (q_{ix}, q_{iy}, q_{iz})$ (i=0,1,2,...):

$$X = \begin{bmatrix} (q_0 - \bar{q})^T \\ (q_1 - \bar{q})^T \\ (q_2 - \bar{q})^T \\ \cdots \\ (q_{N-1} - \bar{q})^T \end{bmatrix} \quad j = \frac{1}{2} \begin{bmatrix} q_0^T q_0 - R \\ q_1^T q_1 - R \\ q_2^T q_2 - R \\ \cdots \\ q_{N-1}^T q_{N-1} - R \end{bmatrix}.$$

Since this device derives a new offset as an optimization problem of the distribution with a constraint condition, it is possible to derive the new offset by solving simple simultaneous linear equations as described later in the embodiments. That is, no matter what the distribution of the data set of statistical population is, it is possible for this device to derive, through a simple process, the most probable new offset which can be derived from the data set of statistical population.

An inventive magnetic measurement apparatus comprises the magnetic data processing device described above; and the 3D magnetic sensor.

No matter what the distribution of the data set of statistical population is, it is possible for this device to derive, through a simple process, the most probable new offset which can be derived from the data set of statistical population.

The function of each of the plurality of parts included in the device of the present invention is realized by a hardware resource, the function of which is specified by its construction, a hardware resource, the function of which is specified by a program, or a combination of these resources. The function of each of the plurality of parts is not necessarily realized by a physically independent hardware resource. The present invention can be specified not only by a device but also by a program, a recording medium on which the program is recorded, and a method. The operations of the method described in the claims are not necessarily performed in the order as described in the claims and may be performed in any other order or at the same time, provided there is no technical impediment.

Embodiments of the second aspect of the present invention will be described in the following order.

A. FIRST EMBODIMENT

[1. General Description]

1-1. Hardware Structure 1-2. Software Structure

[2. Procedure]

Figure 12:
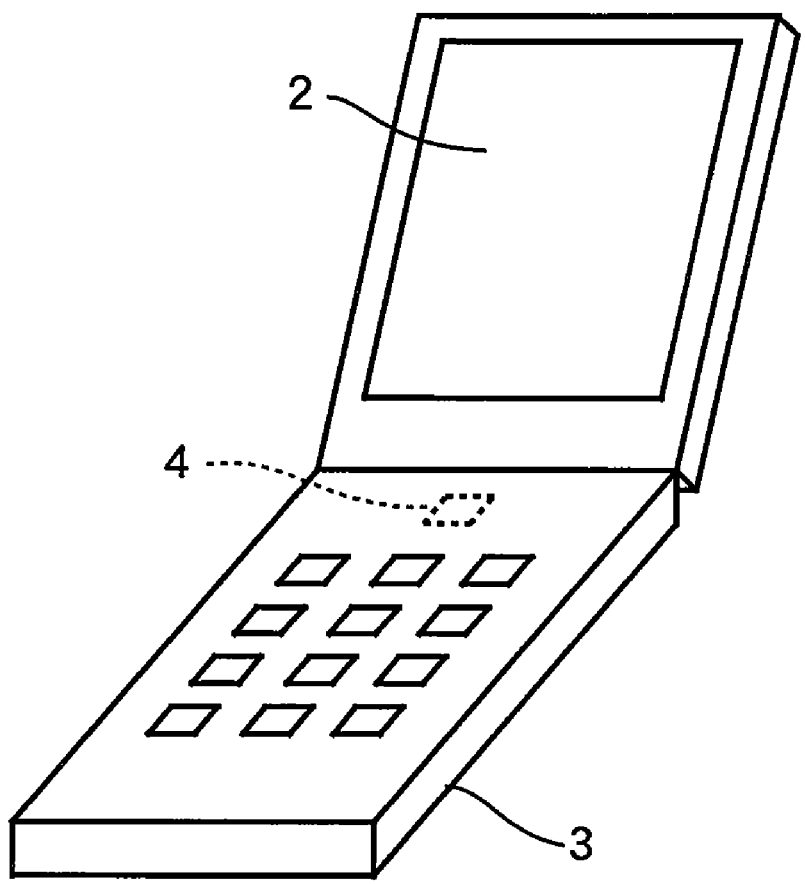
FIG. 12 is a schematic diagram of the embodiments of the second aspect of the present invention.
Figure 12:
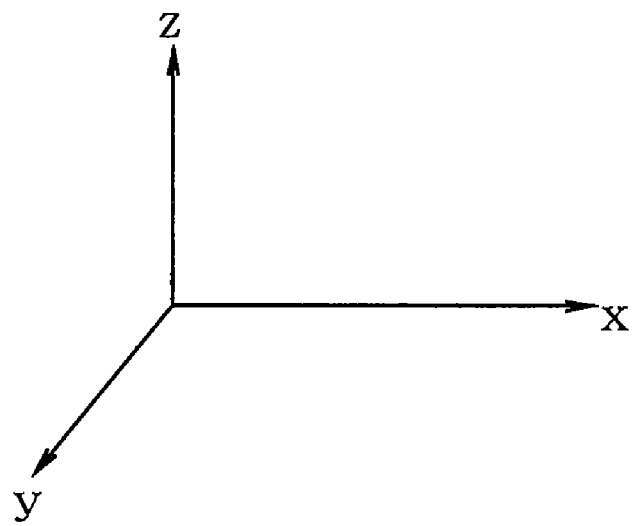

2-1. Overall Flow 2-2. Buffer Update 2-3. Estimation of Distribution 2-4. Derivation of New Offset through Optimization Problem 2-5. Constraint Condition when the Distribution is Two-Dimensional 2-6. Constraint Condition when the Distribution is Substantially One-Dimensional 2-7. Derivation of New Offset when the Distribution is Three-Dimensional
2-8. Summary
B. Second Embodiment
Overview
Estimation of Distribution
Derivation of New Offset
C. Other Embodiments
[General Description]
1-1. Hardware Structure FIG. 12 is a schematic diagram of an external appearance of a mobile phone 3 that is an example of a moving body to which the present invention is applied. The mobile phone 3 includes a 3-dimensional (3D) magnetic sensor 4. The 3D magnetic sensor 4 detects the direction and intensity of a magnetic field by detecting respective intensities of the magnetic field in three orthogonal directions (x, y, z). A display 2 of the mobile phone 3 displays a variety of character or image information. For example, the display 2 displays a map and an arrow or characters representing the orientation (or azimuth).

Figure 13:
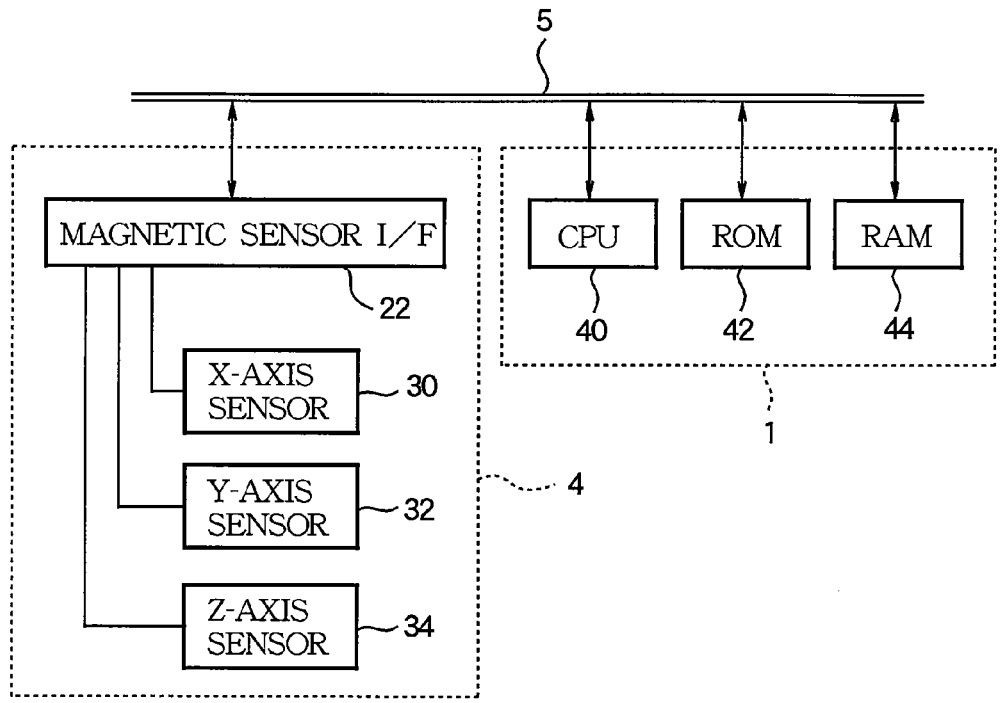
FIG. 13 is a block diagram of the embodiments of the second aspect of the present invention.

FIG. 13 is a block diagram of a magnetic measurement device which includes a 3D magnetic sensor 4 and a magnetic data processing device 1. The 3D magnetic sensor 4 includes x, y, and z-axis sensors 30, 32, and 34 that detect x, y, and z direction components of a magnetic field vector due to terrestrial magnetism. Each of the x, y, and z-axis sensors 30, 32, and 34 includes a magnetic resistance element, a hall sensor, or the like, which may be any type of 1-dimensional magnetic sensor provided that it has directivity. The x, y, and z-axis sensors 30, 32, and 34 are fixed so that their sensitive directions are perpendicular to each other. Outputs of the x, y, and z-axis sensors 30, 32, and 34 are time-divided and input to a magnetic sensor interface (I/F) 22. The magnetic sensor interface 22 analog-to-digital converts inputs from the x, y, and z-axis sensors 30, 32, and 34 after amplifying the inputs. Digital magnetic data output from the magnetic sensor interface 22 is input to the magnetic data processing device 1 through a bus 5.

The magnetic data processing device 1 is a computer including a CPU 40, a ROM 42, and a RAM 44. The CPU 40 controls overall operations of, for example, the mobile phone 3. The ROM 42 is a nonvolatile storage medium which stores a magnetic data processing program or a variety of programs (for example, a navigation program) used to implement functions of the moving body, which are executed by the CPU 40. The RAM 44 is a volatile storage medium which temporarily stores data to be processed by the CPU 40. The magnetic data processing device 1 and the 3D magnetic sensor 4 may be constructed as a one-chip magnetic measurement device.

1-2. Software Structure

Figure 14:
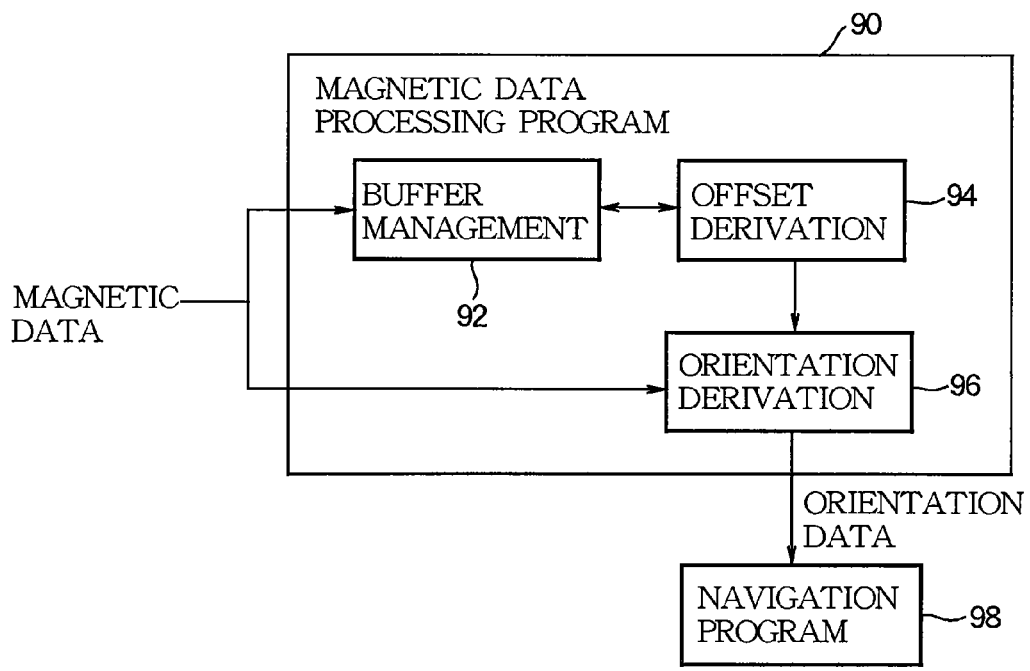
FIG. 14 is a block diagram of the embodiments of the second aspect of the present invention.

FIG. 14 is a block diagram of a magnetic data processing program 90. The magnetic data processing program 90 is stored in the ROM 42 to provide orientation data to a navigation program 98. The orientation data is 2D vector data representing the orientation of the Earth's magnetic field. As 3D vector data for attitude detection of, for example, a moving body, the orientation data may be provided to other applications. The magnetic data processing program 90 is constructed as a group of modules such as a buffer management module 92, an offset derivation module 94, and an orientation derivation module 96.

The buffer management module 92 is a program part that receives a plurality of magnetic data sequentially output from the magnetic sensor 4 and stores the received magnetic data in a buffer in order to use the magnetic data in offset update. The buffer management module 92 allows the CPU 40, the RAM 44, and the ROM 42 to function as an input part and storage part. This buffer may be embodied not only in hardware but also in software. A magnetic data set stored in this buffer will now be referred to as a data set of statistical population.

The offset derivation module 94 is a program part that derives a new offset based on a data set of statistical population held by the buffer management module 92 and an old offset held by the offset derivation module 94 and updates the old offset with the new offset. The offset derivation module 94 allows the CPU 40, the RAM 44, and the ROM 42 to function as an offset derivation part. Since updating the old offset with the new offset causes the new offset to become an old offset, the "old offset" will be referred to simply as an "offset" in context in which it causes no misunderstanding. Actually, an offset used for orientation data correction is set in one variable and the new offset is derived as a different variable from that variable. When the new offset is derived, it is set in the variable used for orientation data correction. Therefore, the variable used for orientation data correction is that in which the old offset is stored.

The orientation derivation module 96 is a program part that corrects the magnetic data sequentially output from the magnetic sensor using the offset held by the offset derivation module 94 to create orientation data. The orientation derivation module 96 allows the CPU 40, the RAM 44, and the ROM 42 to function as an orientation derivation part. Specifically, the orientation derivation module 96 outputs, as orientation data, all or two of the 3 components obtained by subtracting the components of the offset from the components of the magnetic data which is 3D vector data.

The navigation program 98 is a known program that searches for a route to the destination and displays the route on a map. Since it is easy to recognize the map, the map is displayed such that the orientation of the map matches the real-world orientation. Accordingly, for example, when the mobile phone 3 is rotated, the map displayed on the display 2 is rotated relative to the display 2 such that the map is not rotated relative to the earth. The orientation data is used in this map display processing. Of course, the orientation data may be used only to display north, south, east and west by characters or arrows.

[2. Procedure]
2-1. Overall Flow

Figure 15:
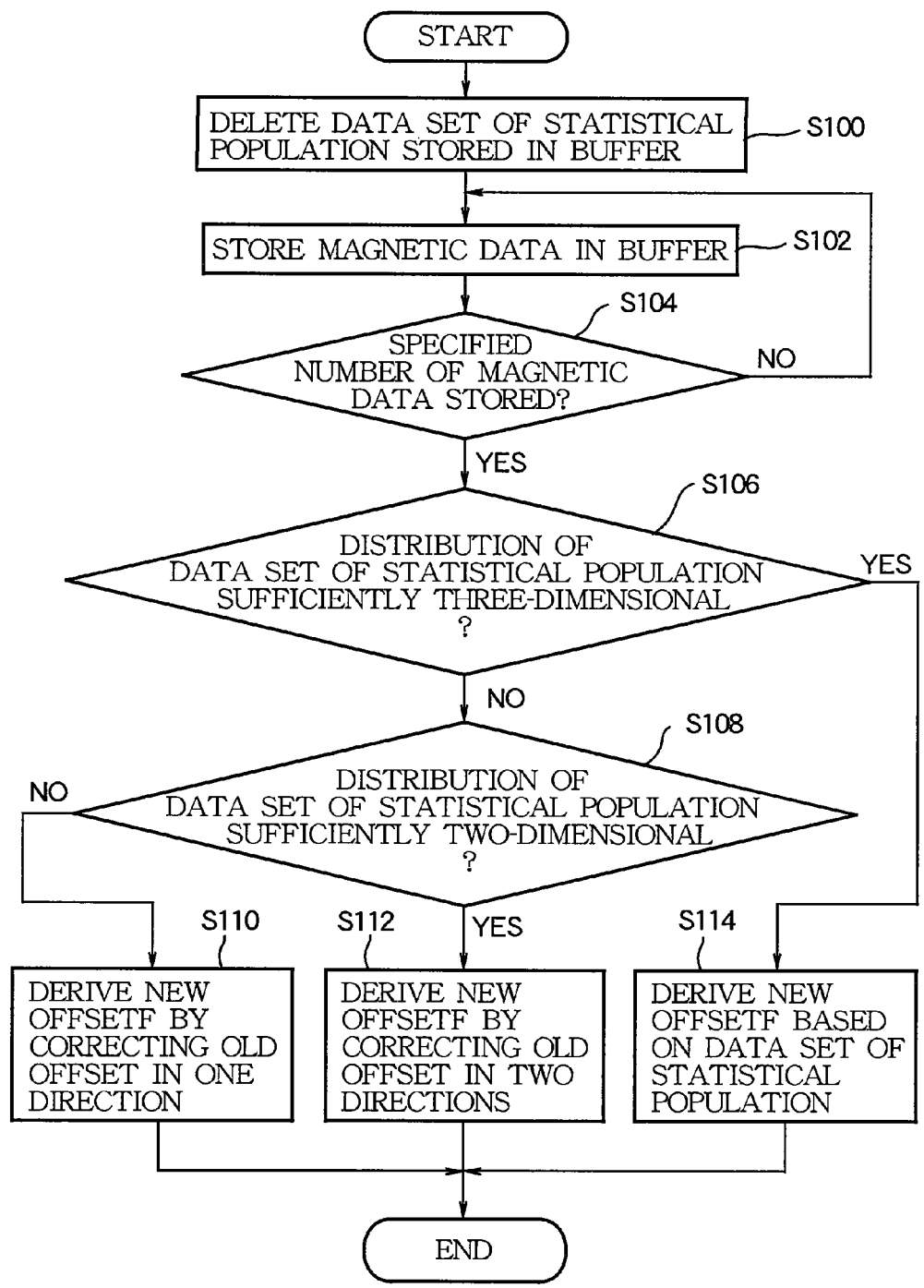
FIG. 15 is a flow chart of the first embodiment of the second aspect of the present invention.

FIG. 15 is a flow chart illustrating a new offset derivation procedure. The CPU 40 performs the procedure of FIG. 15 by executing the offset derivation module 94 when an offset update request has been made.

2-2. Buffer Update

At step S100, all magnetic data stored in the buffer, in which a magnetic data set (data set of statistical population) used for deriving a new offset is stored, is deleted. That is, in this process, a data set of statistical population used for deriving the old offset is deleted.

At step S102, magnetic data used for deriving a new offset is input and stored in the buffer. When a plurality of magnetic data is sequentially input from the magnetic sensor 4 with almost no change in the attitude of the mobile phone 3, the distance between two sequentially input magnetic data (or values) is small. Storing a plurality of near magnetic data in a buffer with a limited capacity wastes memory resources and causes unnecessary buffer update processes. In addition, if a new offset is derived based on a set of near magnetic data, there is a possibility that an inaccurate new offset is derived based on an unevenly distributed data set of statistical population. Whether or not it is necessary to update the buffer may be determined in the following manner. For example, if the distance between the last input magnetic data and magnetic data stored in the buffer immediately before the last input magnetic data is less than a given threshold, it is determined that it is unnecessary to update the buffer and the last input magnetic data is discarded without being stored in the buffer.

At step S104, it is determined whether or not a specified number of magnetic data required to derive an accurate new offset has been stored in the buffer. That is, the number of elements of the data set of statistical population is predetermined. Setting a small number of elements of the data set of statistical population improves response to the offset update request. The processes of steps S102 and S104 are repeated until the specified number of magnetic data is stored in the buffer.

2-3. Estimation of Distribution

Once the specified number of magnetic data is stored in the buffer, the distribution of the data set of statistical population is estimated (S106 and S108). The distribution is estimated based on principle values of the distribution. When the magnetic data set is expressed by the following Equation (31), the principle values of the distribution are eigenvalues of a symmetric matrix A defined by Equations (32), (33), and (34) using the sum of vectors starting from a center (average) of the data set of statistical population and ending with the respective magnetic data.

$$q_i = (q_{ix}, q_{iy}, q_{iz}) (i = 0, 1, 2, ...) \tag{31}$$

$$A = X^T X \tag{32}$$

where $$X = \begin{bmatrix} (q_0 - \bar{q})^T \\ (q_1 - \bar{q})^T \\ (q_2 - \bar{q})^T \\ ... \\ (q_{N-1} - \bar{q})^T \end{bmatrix} \tag{33}$$

$$\bar{q} = \frac{1}{N} \sum_{i=0}^{N-1} q_i \tag{34}$$

The matrix A may also be rewritten as Equation (35).

$$A = \sum_{i=0}^{N-1} (q_i - \bar{q})(q_i - \bar{q})^T \tag{35}$$

Let $\lambda_1$, $\lambda_2$, and $\lambda_3$ be the eigenvalues of the matrix A in increasing order. Let $u_1$, $u_2$, and $u_3$ be mutually orthogonal eigenvectors that correspond to $\lambda_1$, $\lambda_2$, and $\lambda_3$ and have been normalized to size 1. The ranges of $\lambda_1$, $\lambda_2$, and $\lambda_3$ handled in this specification are $\lambda_1>0$, $\lambda_2>0$, and $\lambda_3 \geqq 0$. When two or more eigenvalues of the matrix A are zero, i.e., when the rank of the matrix A is one or less, there is no need to consider it since the number of elements of the data set of statistical population is one or the distribution is a perfectly straight line. Each of the eigenvalues must be zero or a positive real number since the matrix A is a positive semi-definite matrix from its definition.

The distribution of the data set of statistical population is estimated based on the ratio $\lambda_3/\lambda_1$ of the minimum eigenvalue to the maximum eigenvalue and the ratio $\lambda_2/\lambda_1$ of an intermediate eigenvalue to the maximum eigenvalue.

At step S106, it is determined whether or not the distribution of the data set of statistical population is sufficiently three-dimensional. Specifically, the determination is affirmative when the following condition (36) is satisfied and negative when it is not satisfied.

$$\lambda_3/\lambda_1 > t_1 \text{ and } \lambda_2/\lambda_1 > t_2 \tag{36}$$

Here, "$t_1$," and "$t_2$" are predetermined constant values.

How to set the values of the values $t_1$ and $t_2$ is a design option and they can be set optionally based on how to determine derivation characteristics of the offset. When the condition (36) is satisfied, the data set of statistical population is distributed isotropically from the center of the data set of statistical population. The isotropic distribution of the data set of statistical population about the center indicates that the data set of statistical population is distributed evenly near a specific spherical surface.

At step S108, it is determined whether or not the distribution of the data set of statistical population is sufficiently two-dimensional. Specifically, the determination is affirmative when the following condition (37) is satisfied and negative when it is not satisfied.

$$\lambda_3/\lambda_1 \leqq t_1 \text{ and } \lambda_2/\lambda_1 > t_2 \tag{37}$$

When the condition (37) is satisfied, the data set of statistical population is distributed isotropically from the center of the data set of statistical population in a range restricted near a specific plane. The isotropic distribution of the data set of statistical population about the center in a range restricted near a specific plane indicates that the data set of statistical population is unevenly distributed near the circumference of a sectional circle of a specific spherical surface.

When the determination of step S108 is negative, the distribution of the data set of statistical population is substantially one-dimensional (i.e., linear). The substantially linear distribution of the data set of statistical population indicates that the data set of statistical population is unevenly distributed on a short arc of a sectional circle of a specific spherical surface or on both ends of a diameter of the sectional circle.

2-4. Derivation of New Offset through Optimization Problem

An optimization problem for deriving a new offset will now be described.

When the data set of statistical population includes 4 magnetic data not present on the same plane, a spherical surface on which the data set of statistical population is distributed is uniquely specified without using a statistical technique. A position vector $c=(c_x, c_y, c_z)$ of the center of this spherical surface is obtained by solving simultaneous equations (38). Although four equality constraints exist for three variables, the equations (38) must have a solution since one of the four equality constraints is redundant.

$$\begin{bmatrix} (q_0 - \bar{q})^T \\ (q_1 - \bar{q})^T \\ (q_2 - \bar{q})^T \\ (q_3 - \bar{q})^T \end{bmatrix} c = \frac{1}{2} \begin{bmatrix} q_0^T q_0 - R \\ q_1^T q_1 - R \\ q_2^T q_2 - R \\ q_3^T q_3 - R \end{bmatrix} \tag{38}$$

where $$R = \frac{1}{N} \sum_{i=0}^{N-1} q_i^T q_i \tag{39}$$

When the number of elements of the data set of statistical population is 5 or more, "j" is defined by the following equation (40).

$$j = \frac{1}{2}\begin{bmatrix} q_0^T q_0 - R \\ q_1^T q_1 - R \\ q_2^T q_2 - R \\ \cdots \\ q_{N-1}^T q_{N-1} - R \end{bmatrix} \quad (40)$$

Here, if simultaneous linear equations (41) for "c" have a solution, the solution is the center of a spherical surface on which the data set of statistical population is distributed.

$$Xc = j \quad (41)$$

However, if an inherent measurement error of the 3D magnetic sensor 4 is considered, it is practically impossible for Equations (41) to have a solution. A vector "e" defined by the following equation (42) is introduced to obtain a plausible solution through a statistical technique.

$$e = Xc - j \quad (42)$$

"c" which minimizes $\|e\|_2^2$ (that is, $e^T e$) can be considered to be plausible as the center of a spherical surface closest to the distribution of the data set of statistical population. A problem for finding the value "c" minimizing $\|e\|_2^2$ is an optimization problem for minimizing an objective function of the following equation (43) when the matrix A is nonsingular.

$$\text{Objective Function: } f(c) = (Xc-j)^T(Xc-j) \to \min \quad (43)$$

2-5. Constraint Condition when the Distribution is Two-Dimensional

Figure 16:
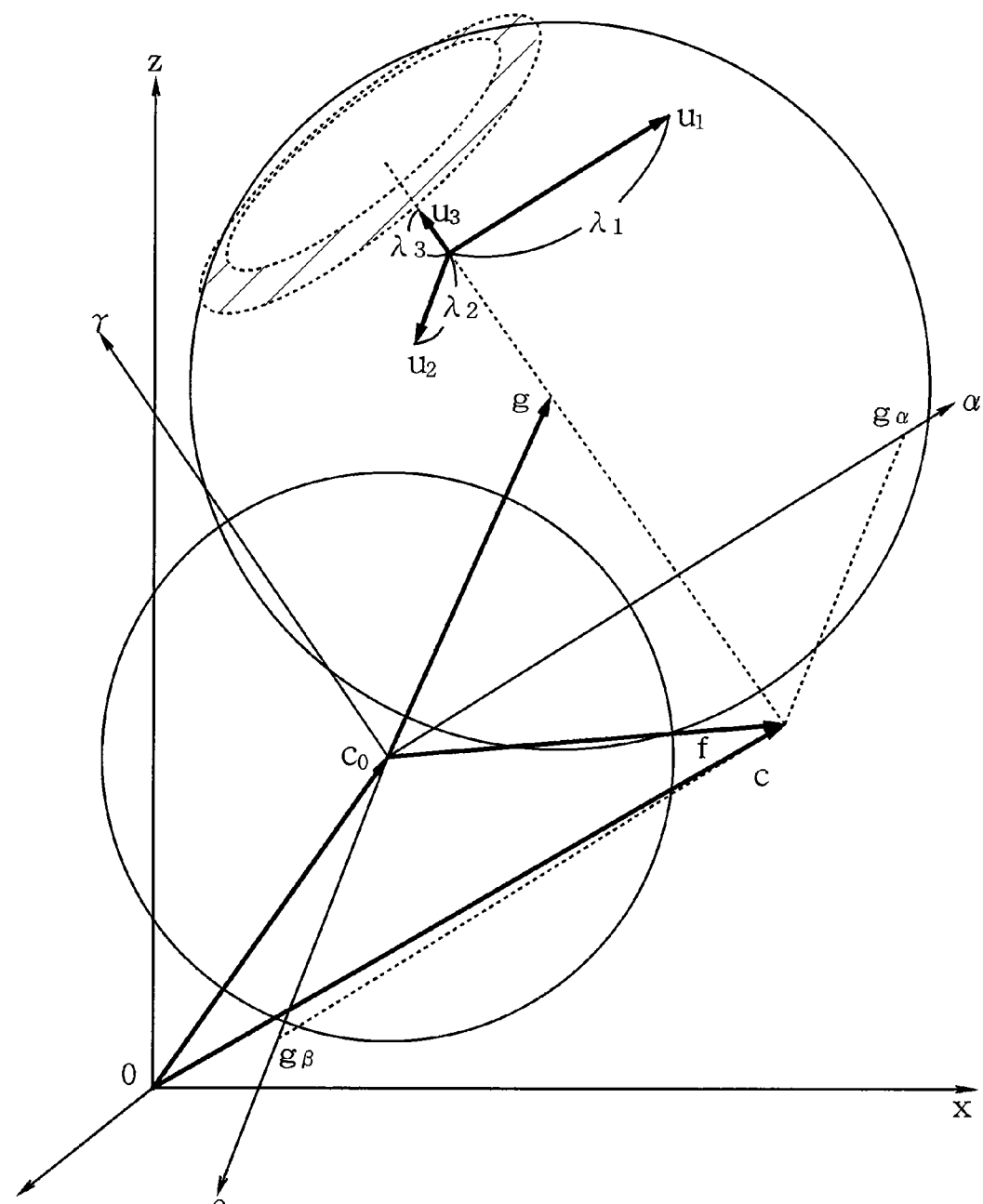
FIG. 16 is a schematic diagram of the first embodiment of the second aspect of the present invention.

As shown in FIG. 16, when the distribution of the data set of statistical population is two-dimensional (i.e., planar), a new offset is derived by restricting directions in which the old offset is corrected to two orthogonal directions (S112). When the data set of statistical population is distributed near a specific plane and the distribution is discrete in a direction normal to the plane, the distribution of the data set of statistical population in a direction parallel to the plane is sufficiently reliable while the distribution of the data set of statistical population in the direction normal to the plane is unreliable. In this case, the old offset is not corrected in the direction normal to the plane, thereby preventing the offset from being updated based on unreliable information.

When the data set of statistical population is distributed near a specific plane and the distribution is discrete in a direction normal to the plane, the direction normal to the plane is coincident with the direction of an eigenvector $u_3$ corresponding to the minimum eigenvalue $\lambda_3$ and orthogonal directions parallel to the plane are coincident with the directions of eigenvectors $u_1$ and $u_2$ corresponding respectively to the maximum eigenvalue $\lambda_1$ and the intermediate eigenvalue $\lambda_2$. Accordingly, in order to derive a new offset without correcting the old offset in the direction normal to the plane, a new offset c which minimizes the objective function of Equation (43) is found under a constraint condition expressed by the following equation (44).

$$c = c_0 + \beta_1 u_1 + \beta_2 u_2 \; (\beta_1, \beta_2 : \text{real numbers}) \quad (44)$$

Equation (44) is equivalent with the following equation (45).

$$u_3^T(c - c_0) = 0 \quad (45)$$

The equation for solving the optimization problem of Equation (43) under the constraint condition of Equation (45) can be modified to its equivalent simultaneous equations using the method of Lagrange multipliers. When an unknown constant multiplier p is introduced and "x" is defined by the following equation (46), simultaneous linear equations (47) of "x" are the above-mentioned simultaneous equations.

$$x = \begin{bmatrix} c \\ \rho \end{bmatrix} \quad (46)$$

$$B_4 x = b_4 \quad (47)$$

where $$B_4 = \begin{bmatrix} 2A & u_3 \\ u_3^T & 0 \end{bmatrix} \quad (48)$$

$$b_4 = \begin{bmatrix} 2X^T & j \\ u_3^T & c_0 \end{bmatrix} \quad (49)$$

As can be understood from the above description, if the distribution of the data set of statistical population is two-dimensional, the process for deriving the new offset at step S112 is to solve the simultaneous linear equations (47).

The solution "x" must be uniquely specified since the rank of the matrix $B_4$ must be 4.

Figure 17:
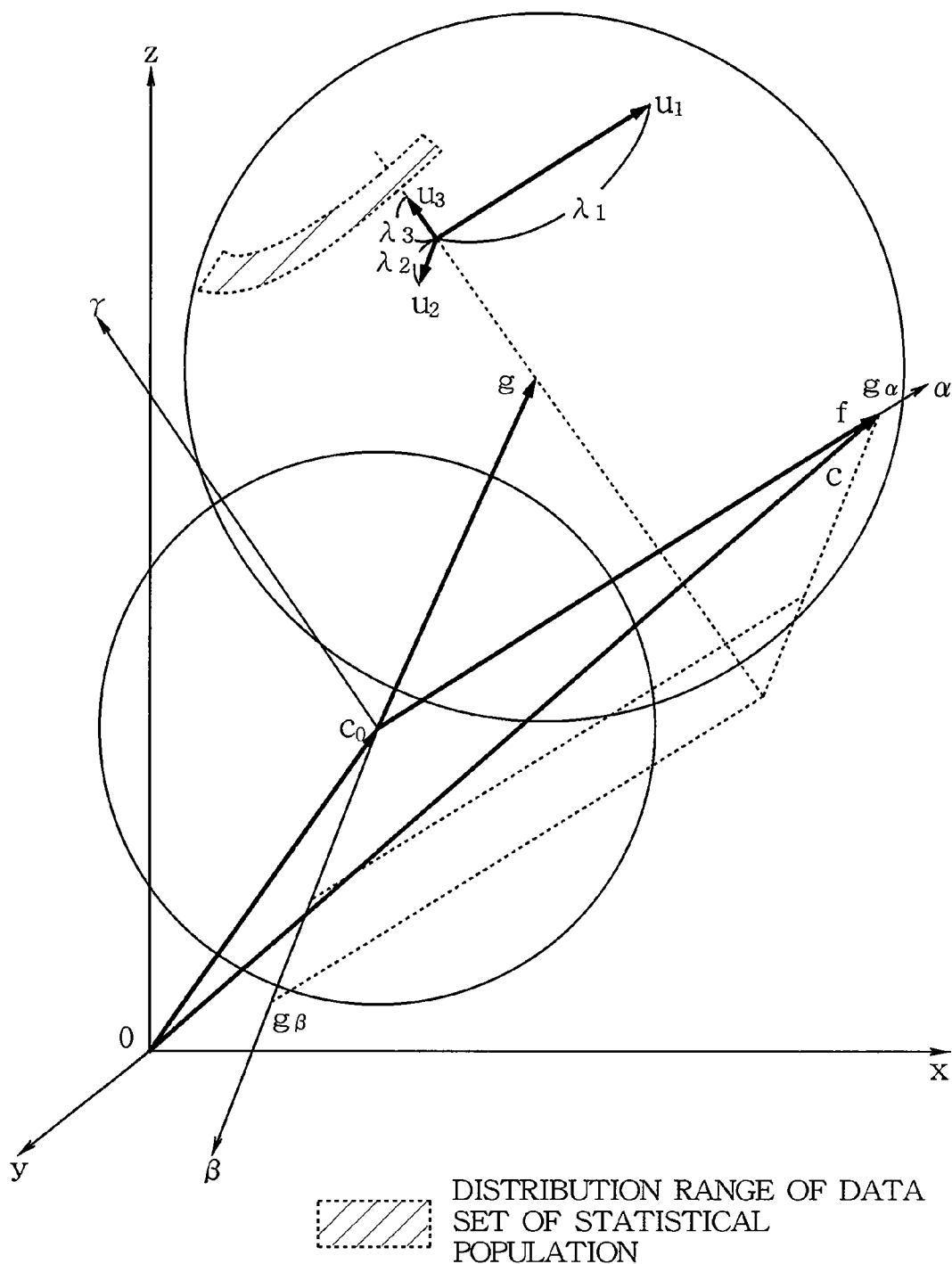
FIG. 17 is a schematic diagram of the first embodiment of the second aspect of the present invention.

2-6. Constraint Condition when the Distribution is Substantially One-Dimensional As shown in FIG. 17, when the distribution of the data set of statistical population is substantially one-dimensional (i.e., linear), a new offset is derived by restricting directions in which the old offset is corrected to one principle direction of the distribution (S110). When the data set of statistical population is distributed near a specific line and the distribution is discrete in the direction of the line, the distribution of the data set of statistical population in the direction of the straight line is sufficiently reliable while the distribution of the data set of statistical population in other directions is unreliable. In this case, the old offset is not corrected in directions other than the direction of the line, thereby preventing the offset from being updated based on unreliable information.

When the data set of statistical population is distributed near a specific line and the distribution is discrete in the direction of the line, the direction of the line is coincident with the direction of an eigenvector $u_1$ corresponding to the maximum eigenvalue $\lambda_1$ and the other directions are coincident with the directions of eigenvectors $u_2$ and $u_3$ corresponding respectively to the intermediate eigenvalue $\lambda_2$ and the minimum eigenvalue $\lambda_3$.

Accordingly, in order to derive a new offset only in the direction of the line, a new offset c which minimizes the objective function of Equation (43) is found under a constraint condition expressed by the following equation (50).

$$c = c_0 + \beta_1 u_1 \quad (50)$$

Equation (50) is equivalent with the following equations (51).

$$u_2^T(c - c_0) = 0 \text{ and } u_3^T(c - c_0) = 0 \quad (51)$$

The equation for solving the optimization problem of Equation (43) under the constraint condition of Equation (51) can be modified to its equivalent simultaneous equations using the method of Lagrange multipliers. When unknown constant multipliers $\rho_1$ and $\rho_2$ are introduced and "x" is defined by the following equation (52), simultaneous linear equations (53) of "x" are the above-mentioned simultaneous equations.

$$x = \begin{bmatrix} c \\ \rho_1 \\ \rho_2 \end{bmatrix} \quad (52)$$

$$B_5 x = b_5 \quad (53)$$

where $$B_5 = \begin{bmatrix} 2A & u_2 & u_3 \\ u_2^T & 0 & 0 \\ u_3^T & 0 & 0 \end{bmatrix} \quad (54)$$

$$b_5 = \begin{bmatrix} 2X^T j \\ u_2^T c_0 \\ u_3^T c_0 \end{bmatrix} \quad (55)$$

As can be understood from the above description, if the distribution of the data set of statistical population is substantially one-dimensional, the process for deriving the new offset at step S110 is to solve the simultaneous linear equations (53). The solution "x" must be uniquely specified since the rank of the matrix $B_5$ must be 5.

2-7. Derivation of New Offset when the Distribution is Three-Dimensional

When the distribution is three-dimensional, a new offset is derived without restricting directions in which the old offset is corrected (S114). When the distribution is three-dimensional, i.e., if the data set of statistical population is distributed in all directions to a certain extent when seen from the center of the data set of statistical population, the data set of statistical population is sufficiently reliable in all directions. Accordingly, in this case, to derive the new offset, it is unnecessary to use the old offset and thus the new offset can be derived based on the data set of statistical population without using the old offset. An algorithm for deriving a new offset based on the data set of statistical population without using the old offset may be an algorithm using one of a variety of statistical techniques that have been suggested and may also be an algorithm using no statistical technique as described in Japanese Patent Application Nos. 2005-337412 and 2006-44289 that have already been filed by the present applicant.

In this embodiment, a new offset is derived using a statistical technique. That is, at step S114, the new offset "c" is derived as a solution to the optimization problem for minimizing the objective function of Equation (43) without any constraint condition.

2-8. Summary

The processes of steps S110, S112, and S114 will now be described using spatial concepts with reference to FIGS. 1, 6, and 7. If it is assumed that the data set of statistical population is completely reliable, the new offset c is defined by the following equation (56) by considering the new offset c as the sum of the old offset $c_0$ and a position vector g of the center of a spherical surface, derived from only the data set of statistical population, relative to the old offset $c_0$.

$$c = c_0 + g \quad (56)$$

The position vector g derived as a solution to the optimization problem for minimizing the objective function of Equation (43) without any constraint condition is a linear combination of fundamental vectors in the same directions as the eigenvectors $u_1$, $u_2$, and $u_3$ of the distribution. Therefore, a correction vector "f", which corresponds to a vector corrected from the position vector "g" according to the respective degrees of reliability of the components of the position vector "g", can be obtained by weighting coefficients $g_\alpha$, $g_\beta$, and $g_\gamma$ of the position vector "g" according to the respective degrees of reliability of the data set of statistical population in the corresponding principle axis directions (see FIG. 11).

In the process of step S112 which is performed when the distribution of the data set of statistical population is two-dimensional as shown in FIG. 16, the following constraint condition is imposed when deriving a new offset based on the old offset $c_0$ and the data set of statistical population. The constraint condition is that the new offset c be obtained as the sum of the old offset $c_0$ and a correction vector "f" that is obtained by weighting both a coefficient $g_\alpha$ of the position vector "g" in a principle axis direction of the distribution corresponding to the maximum principle value of the distribution (i.e., corresponding to the maximum eigenvalue $\lambda_1$) and a coefficient $g_\beta$ in a principle axis direction of the distribution corresponding to the intermediate principle value of the distribution (i.e., corresponding to the intermediate eigenvalue $\lambda_2$) by a weighting factor of "1" of the position vector "g" and weighting a coefficient $g_\gamma$ in a principle axis direction of the distribution corresponding to the minimum principle value of the distribution (i.e., corresponding to the minimum eigenvalue $X_3$) by a weighting factor of "0" of the position vector "g".

In the process of step S110 which is performed when the distribution of the data set of statistical population is substantially one-dimensional as shown in FIG. 17, the following constraint condition is imposed when deriving a new offset based on the old offset $c_0$ and the data set of statistical population. The constraint condition is that the new offset c be obtained as the sum of the old offset $c_0$ and a correction vector "f" that is obtained by weighting a coefficient $g_\alpha$ of the position vector "g" in a principle axis direction (or a principle direction) of the distribution corresponding to the maximum principle value of the distribution (i.e., corresponding to the maximum eigenvalue $\lambda_1$) by a weighting factor of "1" of the position vector "g" and weighting both a coefficient $g_\beta$ in a principle axis direction of the distribution corresponding to the intermediate principle value of the distribution (i.e., corresponding to the intermediate eigenvalue $\lambda_2$) and a coefficient $g_\gamma$ in a principle axis direction of the distribution corresponding to the minimum principle value of the distribution (i.e., corresponding to the minimum eigenvalue $\lambda_3$) by a weighting factor of "0" of the position vector "g".

In the process of step S110 which is performed when the distribution of the data set of statistical population is three-dimensional, any specific constraint condition is not imposed. That is, at step S110, the new offset c is obtained as the sum of the old offset $c_0$ and the position vector "g" that is obtained as a solution to the optimization problem for minimizing the objective function of Equation (43) without any constraint condition.

B. SECOND EMBODIMENT

Overview

In the first embodiment, the distribution of the data set of statistical population is estimated discretely and, when the distribution is two-dimensional, the new offset "c" is derived by setting, to zero, the component of the correction vector "f" in the principle axis direction in which the principle value is the minimum value and, when the distribution is one-dimensional, the new offset "c" is derived by setting, to zero, the components of the correction vector "f" in the two principle axis directions in which the principle values are the intermediate and minimum values. In the second embodiment, a description will be given of a simple, highly accurate algorithm that can eliminate the need to perform different processes according to estimations of the distribution as in the first embodiment and can also derive a more probable new offset by efficiently using the data set of statistical population.

Figure 18:
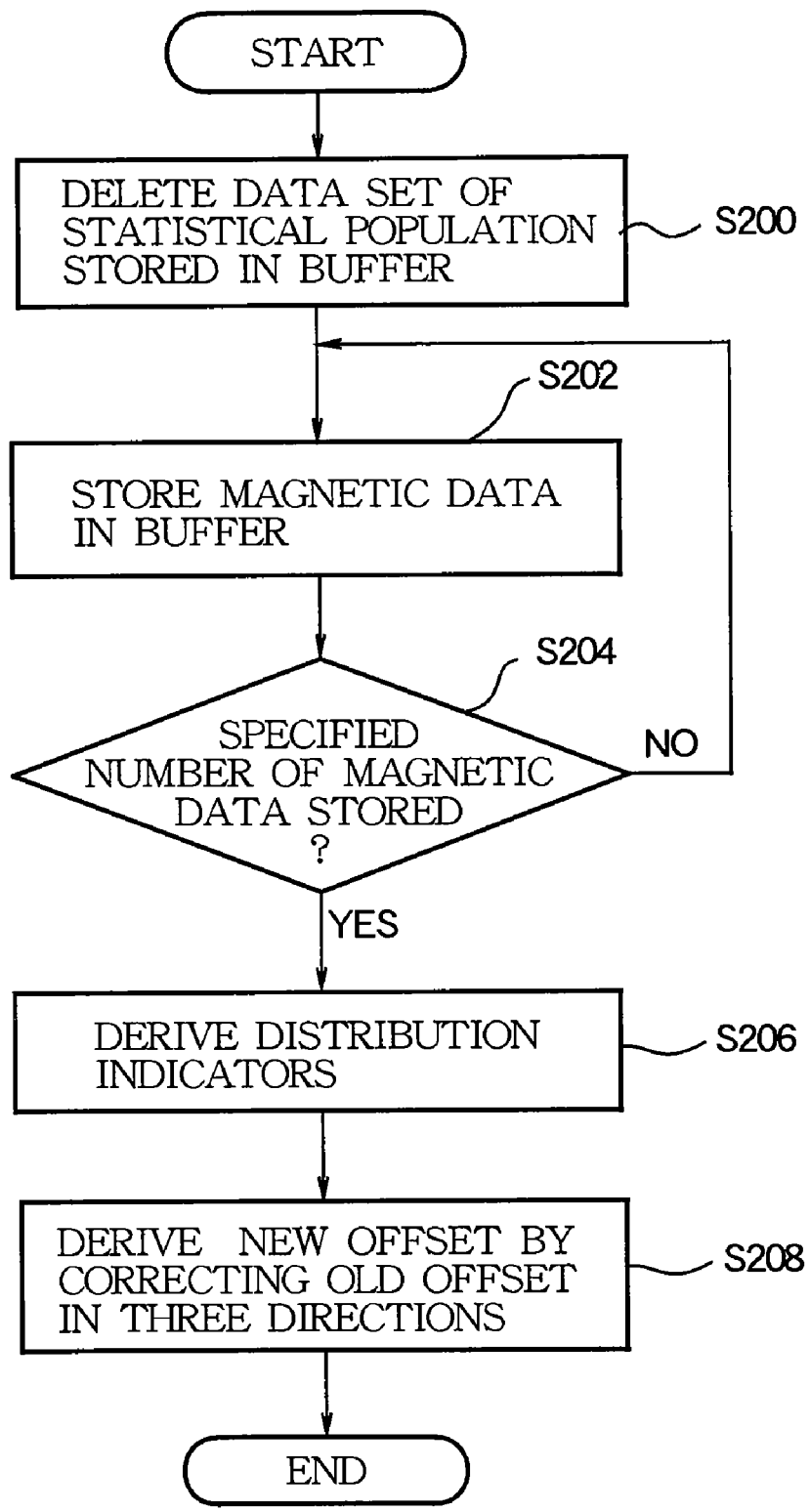
FIG. 18 is a flow chart of the second embodiment of the second aspect of the present invention.

FIG. 18 is a flow chart illustrating a new offset derivation process. In the same manner as in the first embodiment, the CPU 40 performs the procedure of FIG. 18 by executing the offset derivation module 94 when an offset update request has been made. The process of step S200 is the same as that of the process of step S100 described above in the first embodiment. The process of step S202 is the same as that of the process of step S102 described above in the first embodiment. The process of step S204 is the same as that of the process of step S104 described above in the first embodiment.

Estimation of Distribution

At step S206, distribution indicators of the data set of statistical population are derived. That is, the distribution of the data set of statistical population is estimated as continuous values by deriving, as distribution indicators, $m_2$ and $m_3$ defined by the following equations (57) and (58).

$$m_2 = 1 - \left(\frac{\lambda_2}{\lambda_1}\right)^{k_2} \quad (57)$$

$$m_3 = 1 - \left(\frac{\lambda_3}{\lambda_1}\right)^{k_3} \quad (58)$$

Here, "$k_2$" and "$k_3$" are predetermined positive constant numbers. The values of $k_2$ and $k_3$ determine the association between principle values and the degrees of reliability of corresponding principle axis directions of the data set of statistical population. Here, "$m_2$" and "m3" must satisfy the following conditions (59).

$$0 \leq m_2 < 1 \text{ and } 0 \leq m_3 \leq 1 \quad (59)$$

The values of coefficients $k_2$ and $k_3$ are adequately determined in accordance with embodiments of the invention, since the effect of the weighting depends on the values of the coefficients $k_2$ and $k_3$. In case that the magnetic sensor is mounted on a portable object such as a portable telephone and PDA which change their posture at relatively fast angular velocity, it is expected that a distribution of a magnetic data group accumulated in a predetermined time interval becomes relatively wide in average. In case that the distribution of the magnetic data is not so wide, an accuracy of the offset would be rather degraded if the offset correction is carried out by significantly weighting the magnetic data group of the principal axis direction having the small principal value since such a data group has low reliability. Therefore, in case that the invention is applied to a portable object where the distribution of the magnetic data group tends to become wide, the values of the coefficients $k_2$ and $k_3$ should be set so that the magnetic data group of the principal axis direction having the small principal value is evaluated with heavy weight only when the distribution of the magnetic data is considerably wide.

On the other hand, in case that the magnetic sensor is mounted on a moving object such as a vehicle which changes its posture in a relatively slow angular velocity, it is expected that a distribution of a magnetic data group accumulated in a predetermined time interval becomes relatively narrow in average. An accuracy of the offset would not be improved if the offset correction is carried out while the magnetic data group of the principal axis direction having the small principal value is not evaluated with a heavy weight although such a magnetic data group is not so reliable, when the distribution of the magnetic data is not so wide. Therefore, in case that the invention is applied to a moving object where the distribution of the magnetic data group tends to become narrow, the values of the coefficients $k_2$ and $k_3$ should be set so that the magnetic data group of the principal axis direction having the small principal value is evaluated with heavy weight even when the distribution of the magnetic data is narrow.

The spatial concept of $m_2$ and $m_3$ will now be described with reference to FIG. 11. When the coefficients of the components of the position vector g in the principle axis directions of the distribution are denoted by $g_\alpha$, $g_\beta$, and $g_\gamma$ in decreasing order of the corresponding principle values and the coefficients of the components of the position vector f in the principle axis directions of the distribution are denoted by $f_\alpha$, $f_\beta$, and $f_\gamma$ in decreasing order of the corresponding principle values, the relationships between the position vector g, the correction vector f, and $m_2$ and $m_3$ are expressed by the following equations (60), (61), and (62).

$$\frac{f_\alpha}{g_\alpha} = 1 \quad (60)$$

$$\frac{f_\beta}{g_\beta} = \frac{\left(\frac{\lambda_2}{\lambda_1}\right)m_2 - \left(\frac{\lambda_2}{\lambda_1}\right)}{\left(\frac{\lambda_2}{\lambda_1}\right)m_2 - \left(\frac{\lambda_2}{\lambda_1}\right) - m_2^2} \quad (61)$$

$$\frac{f_\gamma}{g_\gamma} = \frac{\left(\frac{\lambda_3}{\lambda_1}\right)m_3 - \left(\frac{\lambda_3}{\lambda_1}\right)}{\left(\frac{\lambda_3}{\lambda_1}\right)m_3 - \left(\frac{\lambda_3}{\lambda_1}\right) - m_3^2} \quad (62)$$

The relationship equations determined such that the weighting factors continuously correspond to the ratios of principle values are not limited to Equations (60), (61), and (62). In addition, the weighting factor $f_\alpha/g_\alpha$ associated with the component of the principle axis direction corresponding to the maximum principle value may be set to be lower than "1".

Derivation of New Offset

When it is difficult to derive a solution to the optimization problem under a specific constraint condition, a relaxation problem for solving the optimization problem by relaxing the constraint condition may be introduced. By applying this relaxation problem, this embodiment realizes a process for deriving a new offset c as the sum of the old offset $c_0$ and a correction vector f that is obtained by weighting the coefficients $g_\alpha$, $g_\beta$, and $g_\gamma$ of the position vector g (see FIG. 11) described above by weighting factors continuously corresponding to the ratios of principle values of the distribution of the data set of statistical population. The following are details of this process.

Unknown constant multipliers $\rho_1$ and $\rho_2$ are defined as variables required for calculations during the process and c, $\rho_1$, and $\rho_2$ are grouped together into one vector "x" that is defined by the following equation (63).

$$x = \begin{bmatrix} c \\ \rho_1 \\ \rho_2 \end{bmatrix} \quad (63)$$

In addition, a matrix "B" is defined by Equation (64) and a vector "b" is defined by Equation (65).

$$B = \begin{bmatrix} 2A & m_2 u_2 & m_3 u_3 \\ m_2 u_2^T & \frac{1}{2\lambda_1}(m_2 - 1) & 0 \\ m_3 u_3^T & 0 & \frac{1}{2\lambda_1}(m_3 - 1) \end{bmatrix} \quad (64)$$

$$b = \begin{bmatrix} 2X^T j \\ m_2 u_2^T c_0 \\ m_3 u_3^T c_0 \end{bmatrix} \quad (65)$$

The process for deriving a new offset at step S208 is to find a solution to the following simultaneous equations (36). The vector x is uniquely specified since the matrix B must be nonsingular.

$$Bx = b \quad (66)$$

Finding a solution to the simultaneous equations (66) is equivalent to solving the optimization problem for minimizing the objective function of Equation (43) under a constraint condition that a new offset be obtained as the sum of the old offset $c_0$ and a correction vector f whose components are values obtained by weighting the coefficients of the position vector g in the principle axis directions of the distribution corresponding to the principle values by factors $f_\alpha/g_\alpha$, $f_\beta/g_\beta$, and $f_\gamma/g_\gamma$ continuously corresponding to the ratios of principle values of the distribution of the data set of statistical population.

In the second embodiment, it is easy to develop or improve the offset derivation module 94 and the data size of the offset derivation module 94 is also decreased since there is no need to branch the new offset derivation process according to the distribution of the data set of statistical population as described above. In addition, the second embodiment increases the use efficiency with which the data set of statistical population is used by the offset derivation module 94 and also allows the orientation derivation module to correct magnetic data using the most probable offset since the old offset can be corrected in the principle axis directions of the distribution by distances continuously corresponding to the ratios of principle values of the data set of statistical population unless any of the principle values is zero.

C. OTHER EMBODIMENTS

The second aspect of the present invention is not limited to the above embodiments and various embodiments are possible without departing from the spirit of the present invention. For example, the present invention can also be applied to a magnetic sensor that is mounted on a PDA or a magnetic sensor that is mounted on a vehicle.

The invention claimed is:

1. A magnetic data processing device comprising:
an input configured to sequentially input magnetic data that is output from a magnetic sensor, said magnetic data being two-dimensional vector data that is a linear combination of a set of first fundamental vectors;
memory configured to store a plurality of the magnetic data as a data set of statistical population in order to update an old offset of the magnetic data with a new offset; and
an offset derivation module configured to calculate the new offset based on the old offset and the data set of statistical population under a constraint condition such that the new offset is obtained as a sum of the old offset and a correction vector, wherein the correction vector is a linear combination of a set of second fundamental vectors, which are defined in principal axis directions of distribution of the data set of statistical population, and wherein respective coefficients of the linear combination of the second fundamental vectors are obtained by weighting respective coefficients of a temporary position vector of a temporary offset relative to the old offset according to a ratio of principal values of the distribution of the data set of statistical population, said temporary offset being derived from the data set of statistical population without using the old offset and said temporary position vector being a linear combination of the second fundamental vectors.

2. The magnetic data processing device according to claim 1, wherein the constraint condition is that a weighting factor of the temporary position vector for the coefficient of the second fundamental vector in the principal axis direction corresponding to a smaller one of the principal values is zero if a ratio of the smaller principal value to a greater one of the principal values is equal to or less than a predetermined threshold.

3. The magnetic data processing device according to claim 1, wherein the constraint condition is that coefficients of the correction vector are values obtained by weighting the coefficients of the temporary position vector with weighting factors, which continuously correspond to the ratio of the principal values of the distribution of the data set of statistical population.

4. The magnetic data processing device according to claim 1, wherein respective weighting factors for the coefficients of the temporary position vector are normalized with reference to a weighting factor, which is for the coefficient of the second fundamental vector in the principal axis direction corresponding to the greater principal value.

5. The magnetic data processing device according to claim 1, wherein the offset derivation part derives a value "c" of the new offset that minimizes the following objective function f (c) under the constraint condition:

$$f(c) = (Xc-j)^T(Xc-j),$$

where "X" and "j" are as follows when the magnetic data is represented by $q_i = (q_{ix}, q_{iy})$ (i=0,1,2,...), "T" indicates a transposed vectors, and "N" denotes a number of the magnetic data $-q_i$:

$$X = \begin{bmatrix} (q_0 - \bar{q})^T \\ (q_1 - \bar{q})^T \\ (q_2 - \bar{q})^T \\ \ldots \\ (q_{N-1} - \bar{q})^T \end{bmatrix} \quad j = \frac{1}{2} \begin{bmatrix} q_0^T q_0 - R \\ q_1^T q_1 - R \\ q_2^T q_2 - R \\ \ldots \\ q_{N-1}^T q_{N-1} - R \end{bmatrix}.$$

where $$R = \frac{1}{N} \sum_{i=0}^{N-1} q_i^T q_i.$$

6. A magnetic measurement apparatus comprising:
a magnetic sensor configured to output two-dimensional vector data; and
a magnetic data processing device comprising
an input configured to sequentially input the two-dimensional vector data that is a linear combination of a set of first fundamental vectors, memory configured to store a plurality of the two-dimensional vector data as a data set of statistical population in order to update an old offset of the magnetic data with a new offset, and an offset derivation module configured to calculate the new offset based on the old offset and the data set of statistical population under a constraint condition such that the new offset is obtained as a sum of the old offset and a correction vector, wherein the correction vector is a linear combination of a set of second fundamental vectors, which are defined in principal axis directions of distribution of the data set of statistical population, and wherein respective coefficients of the linear combination of the second fundamental vectors are obtained by weighting respective coefficients of a temporary position vector of a temporary offset relative to the old offset according to a ratio of principal values of the distribution of the data set of statistical population, said temporary offset being derived from the data set of statistical population without using the old offset and said temporary position vector being a linear combination of the second fundamental vectors.

7. A magnetic data processing method comprising:

sequentially inputting magnetic data that is output from a magnetic sensor, said magnetic data being two-dimensional vector data that is a linear combination of a set of first fundamental vectors;

storing a plurality of the magnetic data as a data set of statistical population in order to update an old offset of the magnetic data with a new offset; and calculating the new offset based on the old offset and the data set of statistical population under a constraint condition such that the new offset is obtained as a sum of the old offset and a correction vector, wherein the correction vector is a linear combination of a set of second fundamental vectors, which are defined in principal axis directions of distribution of the data set of statistical population, and wherein respective coefficients of the linear combination of the second fundamental vectors are obtained by weighting respective coefficients of a temporary position vector of a temporary offset relative to the old offset according to a ratio of principal values of the distribution of the data set of statistical population, said temporary offset being derived from the data set of statistical population without using the old offset and said temporary position vector being a linear combination of the second fundamental vectors.

8. A machine readable medium for use in a computer, said medium comprising a magnetic data processing program allowing the computer to function as:

an input configured to sequentially input magnetic data that is output from a magnetic sensor, said magnetic data being two-dimensional vector data that is a linear combination of a set of first fundamental vectors;

memory configured to store a plurality of the magnetic data as a data set of statistical population in order to update an old offset of the magnetic data with a new offset; and an offset derivation module configured to calculate the new offset based on the old offset and the data set of statistical population under a constraint condition such that the new offset is obtained as a sum of the old offset and a correction vector, wherein the correction vector is a linear combination of a set of second fundamental vectors, which is defined in principal axis directions of distribution of the data set of statistical population, and wherein respective coefficients of the linear combination of the second fundamental vectors are obtained by weighting respective coefficients of a temporary position vector of a temporary offset relative to the old offset according to a ratio of principal values of the distribution of the data set of statistical population, said temporary offset being derived from the data set of statistical population without using the old offset and said temporary position vector being a linear combination of the second fundamental vectors.

9. A magnetic data processing device comprising:

an input configured to sequentially input magnetic data outputted from a magnetic sensor, said magnetic data being three-dimensional vector data that is a linear combination of a set of first fundamental vectors;

memory configured to store a plurality of the magnetic data as a data set of statistical population in order to update an old offset of the magnetic data with a new offset; and an offset derivation module configured to calculate the new offset based on the old offset and the data set of statistical population under a constraint condition such that the new offset is obtained as a sum of the old offset and a correction vector, wherein the correction vector is a linear combination of a set of second fundamental vectors, which are defined in principal axis directions of distribution of the data set of statistical population, and wherein respective coefficients of the linear combination of the second fundamental vectors are obtained by weighting respective coefficients of a position vector of a temporary offset relative to the old offset according to ratios of principal values of the distribution of the data set of statistical population, said temporary offset being derived from the data set of statistical population without using the old offset and said position vector of the temporary offset being a linear combination of the second fundamental vectors.

10. The magnetic data processing device according to claim 9, wherein the constraint condition is that a weighting factor of the position vector for the coefficient of one of the second fundamental vectors in one of the principal axis directions corresponding to a minimum one of the principal values is zero if a ratio of an intermediate one of the principal values to a maximum one of the principal values is higher than a first threshold and a ratio of the minimum principal value to the maximum principal value is equal to or less than a second threshold, wherein said respective weighting factors of the position vector for the coefficient of the second fundamental vector in the principal axis direction corresponding to the minimum principal value and the coefficient of another of the second fundamental vectors in one of the principal axis directions corresponding to the intermediate principal value is zero if the ratio of the intermediate principal value to the maximum principal value is equal to or less than the first threshold and the ratio of the minimum principal value to the maximum principal value is equal to or less than the second threshold.

11. The magnetic data processing device according to claim 9, wherein the constraint condition is that the coefficients of the correction vector are values obtained by weighting the coefficients of the position vector with weighting factors, which continuously correspond to ratios of the principal values of the distribution of the data set of statistical population.

12. The magnetic data processing device according to claim 9, wherein the respective weighting factors for the coefficients of the position vector are normalized with reference to the weighting factor, which is for the coefficient of the second fundamental vector in the principal axis direction corresponding to the maximum principal value.

13. The magnetic data processing device according to claim 9, wherein the offset derivation part derives a value "c" of the new offset that minimizes the following objective function f (c) under the constraint condition:

$$f(c)=(Xc-j)^T(Xc-j),$$

where "X" and "j" are as follows when the magnetic data is represented by $q_i=(q_{ix},q_{iy})$ (i=0,1,2,...), "T" indicates a transposed vector, and "N" denotes a number of the magnetic data -$q_i$:

$$X = \begin{bmatrix} (q_0 - \overline{q})^T \\ (q_1 - \overline{q})^T \\ (q_2 - \overline{q})^T \\ \cdots \\ (q_{N-1} - \overline{q})^T \end{bmatrix} \quad j = \frac{1}{2} \begin{bmatrix} q_0^T q_0 - R \\ q_1^T q_1 - R \\ q_2^T q_2 - R \\ \cdots \\ q_{N-1}^T q_{N-1} - R \end{bmatrix}.$$

where $$R = \frac{1}{N}\sum_{i=0}^{N-1} q_i^T q_i.$$

14. A magnetic measurement apparatus comprising:
magnetic sensor configured to output three-dimensional vector data; and
a magnetic data processing device comprising
an input configured to sequentially input the three-dimensional vector data that is a linear combination of a set of first fundamental vectors,
memory configured to store a plurality of the three-dimensional vector data as a data set of statistical population in order to update an old offset of the magnetic data with a new offset, and
an offset derivation module configured to calculate the new offset based on the old offset and the data set of statistical population under a constraint condition such that the new offset is obtained as a sum of the old offset and a correction vector,
wherein the correction vector is a linear combination of a set of second fundamental vectors, which are defined in principal axis directions of distribution of the data set of statistical population, and wherein respective coefficients of the linear combination of the second fundamental vectors are obtained by weighting respective coefficients of a position vector of a temporary offset relative to the old offset according to ratios of principal values of the distribution of the data set of statistical population, said temporary offset being derived from the data set of statistical population without using the old offset and said position vector of the temporary offset being a linear combination of the second fundamental vectors.

15. A magnetic data processing method comprising:
sequentially inputting magnetic data that is output from a magnetic sensor, said magnetic data being three-dimensional vector data that is a linear combination of a set of first fundamental vectors;
storing a plurality of the magnetic data as a data set of statistical population in order to update an old offset of the magnetic data with a new offset; and
calculating the new offset based on the old offset and the data set of statistical population under a constraint condition such that the new offset is obtained as a sum of the old offset and a correction vector,
wherein the correction vector is a linear combination of a set of second fundamental vectors, which are defined in principal axis directions of distribution of the data set of statistical population, and wherein respective coefficients of the linear combination of the second fundamental vectors are obtained by weighting respective coefficients of a position vector of a temporary offset relative to the old offset according to ratios of principal values of the distribution of the data set of statistical population, said temporary offset being derived from the data set of statistical population without using the old offset and said position vector of the temporary offset being a linear combination of the second fundamental vectors.

16. A machine readable medium for use in a computer, said medium comprising a magnetic data processing program allowing the computer to function as:
an input configured to sequentially input magnetic data that is output from a magnetic sensor, said magnetic data being three-dimensional vector data that is a linear combination of a set of first fundamental vectors;
a memory configured to store a plurality of the magnetic data as a data set of statistical population in order to update an old offset of the magnetic data with a new offset; and
an offset module configured to calculate the new offset based on the old offset and the data set of statistical population under a constraint condition such that the new offset is obtained as a sum of the old offset and a correction vector,
wherein the correction vector is a linear combination of a set of second fundamental vectors, which are defined in principal axis directions of distribution of the data set of statistical population, and wherein respective coefficients of the linear combination of the second fundamental vectors are obtained by weighting respective coefficients of a position vector of a temporary offset relative to the old offset according to ratios of principal values of the distribution of the data set of statistical population, said temporary offset being derived from the data set of statistical population without using the old offset and said position vector of the temporary offset being a linear combination of the second fundamental vectors.

* * * * *